(12) United States Patent
Giuliano

(10) Patent No.: US 12,395,074 B2
(45) Date of Patent: Aug. 19, 2025

(54) POWER SEMICONDUCTOR PACKAGE

(71) Applicant: Murata Manufacturing Co., Ltd., Kyoto (JP)

(72) Inventor: David Giuliano, San Diego, CA (US)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 18/587,418

(22) Filed: Feb. 26, 2024

(65) Prior Publication Data

US 2024/0283356 A1 Aug. 22, 2024

Related U.S. Application Data

(63) Continuation of application No. 17/357,884, filed on Jun. 24, 2021, now Pat. No. 11,916,475.

(51) Int. Cl.
*H02M 3/00* (2006.01)
*H02M 1/00* (2006.01)
*H02M 3/158* (2006.01)

(52) U.S. Cl.
CPC ......... *H02M 3/003* (2021.05); *H02M 1/0006* (2021.05); *H02M 1/0095* (2021.05); *H02M 3/158* (2013.01)

(58) Field of Classification Search
CPC .... H02M 3/158; H02M 1/0095; H02M 3/003; H02M 1/0006; H02M 7/483; H02M 7/4837

See application file for complete search history.

(56) References Cited

U.S. PATENT DOCUMENTS

| | | | |
|---|---|---|---|
| 5,742,097 A * | 4/1998 | Matsunaga | H01L 25/105 257/E23.079 |
| 10,802,518 B1 | 10/2020 | Luo et al. | |
| 2009/0224732 A1 | 9/2009 | Kudo et al. | |
| 2009/0322296 A1 | 12/2009 | Li et al. | |
| 2013/0094157 A1 | 4/2013 | Giuliano | |
| 2015/0078052 A1 | 3/2015 | Kobayashi et al. | |
| 2019/0296014 A1 | 9/2019 | Kahrimanovic | |
| 2021/0242768 A1 | 8/2021 | Ishikura | |
| 2022/0103066 A1* | 3/2022 | Chen | H02M 3/04 |

* cited by examiner

*Primary Examiner* — Alex Torres-Rivera
(74) *Attorney, Agent, or Firm* — Haynes and Boone, LLP

(57) ABSTRACT

Subject matter disclosed herein may relate to semiconductor devices, and may more particularly relate to power semiconductor packages, for example.

20 Claims, 23 Drawing Sheets

POWER SEMICONDUCTOR PACKAGE

RELATED APPLICATIONS

This application is a continuation of U.S. patent application Ser. No. 17/357,884 (now allowed) filed on Jun. 24, 2021, which is hereby incorporated by reference in its entirety in the present application.

BACKGROUND

Field

Subject matter disclosed herein may relate to semiconductor devices, and may more particularly relate to power semiconductor packages, for example.

Information

Modern electronic devices may incorporate electronic components that may have fairly exacting operating parameters with respect to supply voltages, for example. As such, it may be advantageous to supply components with a quality and stable power source. Many electronic devices include power converters of some type to help provide appropriate power to various components. As power needs for various electronic device types continue to change due to continual development of electronic devices of all sorts, power converters that may achieve desired performance and/or that may be implemented with reduced time, effort and/or cost may be advantageous.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1:
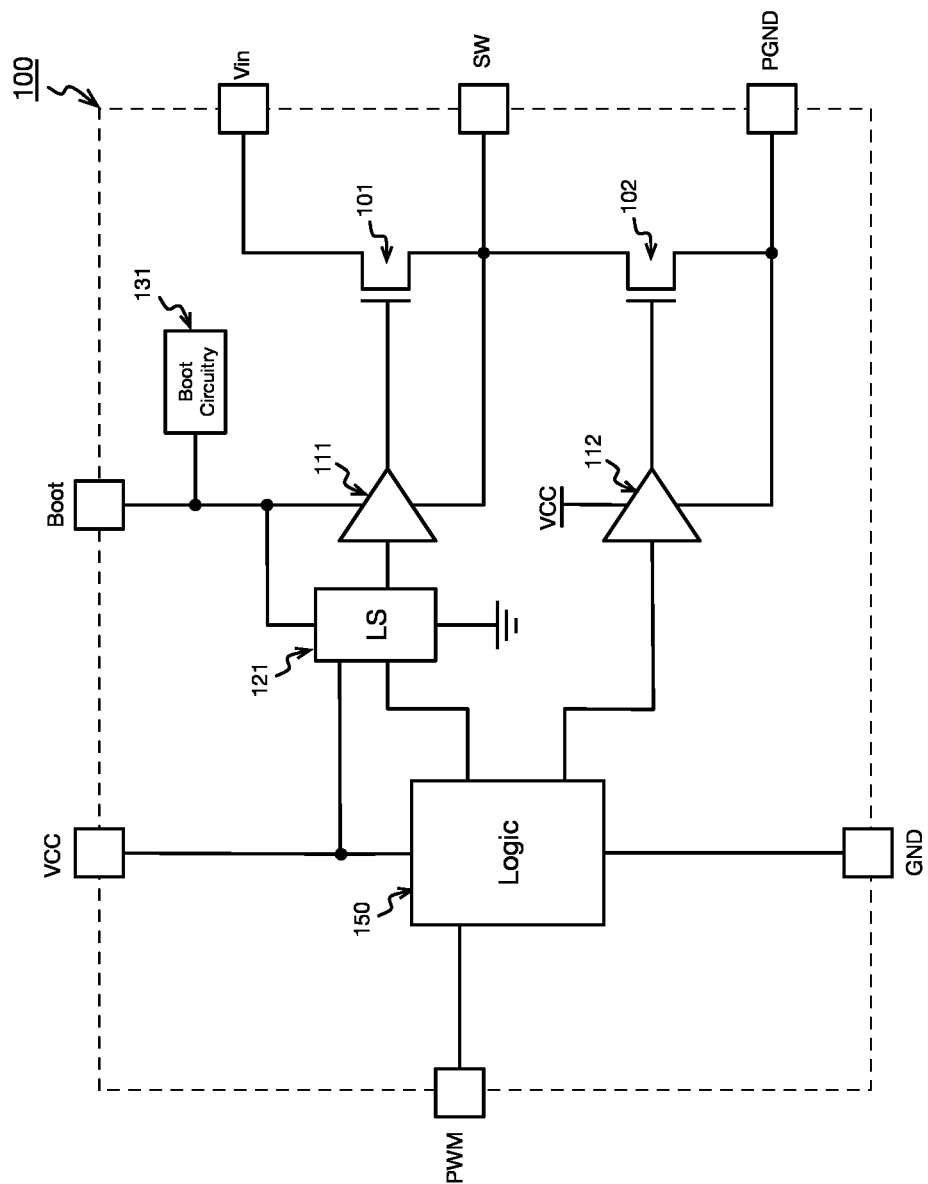
FIG. 1 depicts a schematic block diagram of an example power semiconductor package in accordance with one or more embodiments.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Furthermore, structural and/or other changes may be made without departing from claimed subject matter. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents. Further, it is to be understood that other embodiments may be utilized. Also, embodiments have been provided of claimed subject matter and it is noted that, as such, those illustrative embodiments are inventive and/or unconventional; however, claimed subject matter is not limited to embodiments provided primarily for illustrative purposes. Thus, while advantages have been described in connection with illustrative embodiments, claimed subject matter is inventive and/or unconventional for additional reasons not expressly mentioned in connection with those embodiments. In addition, references throughout this specification to "claimed subject matter" refer to subject matter intended to be covered by one or more claims, and are not necessarily intended to refer to a complete claim set, to a particular combination of claim sets (e.g., method claims, apparatus claims, etc.), or to a particular claim.

DETAILED DESCRIPTION

References throughout this specification to one implementation, an implementation, one embodiment, an embodiment, and/or the like means that a particular feature, structure, characteristic, and/or the like described in relation to a particular implementation and/or embodiment is included in at least one implementation and/or embodiment of claimed subject matter. Thus, appearances of such phrases, for example, in various places throughout this specification are not necessarily intended to refer to the same implementation and/or embodiment or to any one particular implementation and/or embodiment. Furthermore, it is to be understood that particular features, structures, characteristics, and/or the like described are capable of being combined in various ways in one or more implementations and/or embodiments and, therefore, are within intended claim scope. In general, of course, as has always been the case for the specification of a patent application, these and other issues have a potential to vary in a particular context of usage. In other words, throughout the patent application, particular context of description and/or usage provides helpful guidance regarding reasonable inferences to be drawn; however, likewise, "in this context" in general without further qualification refers to the context of the present patent application.

As mentioned, modern electronic devices may incorporate electronic components that may have fairly exacting operating parameters with respect to supply voltages, for example. As such, it may be advantageous to supply components with a quality and stable power source. Many electronic devices (e.g., Internet-of-Things (IoT)-type devices, desktop and/or laptop computing devices, data servers, cellular phones, tablet devices, personal navigation devices, etc.) include power converters of some type to help provide appropriate power to various components. For example, higher performance microprocessors may include billions of transistors, may switch at several gigahertz and/or may consume hundreds of amperes of current at relatively lower voltages (e.g., less than 1.0 V in some circumstances), for example. Further, power consumption characteristics of modern microprocessors are growing with increasing computing performance, leading to challenges with respect to on-board point-of-load (POL)-type converters, for example. Higher efficiency, higher power density and higher bandwidth POL-type converters may be needed to support hundreds of amperes of current (e.g., greater than 50.0 A in some circumstances) being delivered at relatively lower voltages (e.g., less than 1.0 V). Size, cost, and/or performance advantages provided via integration make it desirable to design modular converters, for example, that may be relatively easily scaled in size and/or capabilities for a variety of applications having different voltage and/or current needs.

In some circumstances, efforts to implement power converters to meet the needs of various electronic devices may include a substantially all-discrete approach wherein a power converter may be implemented primarily using discrete components. Such an approach may provide advantages in the way of an ability to customize particular implementations for particular applications. However, drawbacks may include reduced performance (e.g., efficiency), increased cost, increased size, reduced ease-of-manufacture, etc. Additionally, such an approach may pose difficulties in design and/or implementation of timing control, synchronization, etc. Further, increased parasitic characteristics (e.g., capacitance) between components may make it more difficult to operate substantially discrete implementations at higher switching frequencies, for example. Also, such an approach may require custom designs for each particular target application.

In other circumstances, power converters may be implemented via an integrated approach, wherein a power converter may be implemented by integrating the various components into a particular integrated circuit. Such an approach may allow for customization for particular applications, may provide for reduced-size implementations, and/or may allow for relatively easy manufacturing at the system level. However, again, such an approach may require custom designs for particular target applications. Also, customized silicon solutions may have relatively large up-front costs with respect to design and manufacture of the bespoke integrated circuit. Further, design changes may be difficult and/or costly. For example, time-to-build may be substantially longer for custom integrated circuits. Another possible disadvantage of a custom integrated circuit approach may be limited device process availability for given devices/components. For example, a particular fabrication process may only provide a particular type of resistor, a particular type of capacitor, a small selection of field-effect transistor devices, etc. Also, a particular fabrication process may be limited to particular materials. For example, a particular fabrication process may be limited to the use of silicon, while another a different particular fabrication process may be limited to gallium nitride (GaN).

FIG. 1 depicts a schematic block diagram of an example power semiconductor package 100 implemented in one example effort to address, at least in part, needs for increased power density and/or higher power transfer in circumstances with limited real-estate and/or to address needs for increased efficiency at higher switching frequencies and/or at lower voltages. In industry, particular implementations of power semiconductor packages having characteristics such as those depicted in FIG. 1 with example power semiconductor package 100 may sometimes be referred to as a DrMOS ("Driver MOSFET") module and/or the like. As utilized herein, "DrMOS," "DrMOS module" and/or the like refer to a power semiconductor package implemented in substantial compliance with a DrMOS specification (e.g., see DrMOS Specifications Revision 1.0, November 2004 published by Intel® Corporation). Also, as utilized herein, "power semiconductor package" and/or the like refers to power converter circuitry implemented as one or more integrated circuits, one or more semiconductor dies and/or one or more discrete devices encased within a semiconductor package material having a plurality of terminals providing external connection points to the one or more integrated circuits, one or more semiconductor dies and/or the one or more discrete devices encased within the semiconductor package material. Particular implementations of power semiconductor packages may utilize particular integrated circuit packaging technology, such as ball grid array (BGA), for example, although subject matter is not limited in scope in this respect. Thus, for some implementations, a "power semiconductor package" may include one or more integrated circuits, one or more semiconductor die and/or one or more discrete components encased within a ball-grid array package, for example.

Some characteristics of example DrMOS power semiconductor package 100 may include a power transfer path comprising a high-side switch 101 and a low-side switch 102 driving a single switch terminal "SW." In an implementation, switches 101 and 102 may comprise power field-effect transistors (FET), for example. Further, high-side, and low-side driver circuits 111 and 112 may be coupled to control nodes of respective high-side and low-side switches 101 and 102, in an implementation. A single boot terminal, along with boot circuitry 131, for example, may be implemented as depicted in FIG. 1, along with supply voltage (VCC) and reference voltage (GND) terminals. A single level-shifter circuit 121 and logic circuitry 150 may also be included, in an implementation. Additionally, in an implementation, a timing signal may be coupled to logic circuitry 150 via a PWM ("pulse width modulation") terminal. Further, for example power semiconductor package 100, a voltage input signal may be applied to a first node of high-side power transistor 101 via a "Vin" terminal, as depicted in FIG. 1.

As mentioned, example DrMOS-type power semiconductor package 100 and/or the like may be implemented in an effort to address needs for increased power density and/or higher power transfer in circumstances with limited real-estate and/or to address needs for increased efficiency at higher switching frequencies and/or at lower voltages. However, particular aspects of DrMOS-type power semiconductor package, such as exam pie power semiconductor package 100 and/or the like, may limit its versatility and/or utility. For example, the single switch terminal SW tying the high and low-side switches together may prevent power semiconductor package 100 and/or the like from being utilized in more advanced configurations, such as in multi-level and/or series-capacitor buck power converters, for example. The single boot terminal and/or single level shifter circuit, for example, may also limit the versatility and/or utility of example power semiconductor package 100 and/or the like. Additionally, for a DrMOS-type power semiconductor package, such power semiconductor package 100, the PGND terminal may be required according the a DrMOS specification to be connected to a ground reference voltage signal, further limiting its versatility and/or utility.

Figure 2:
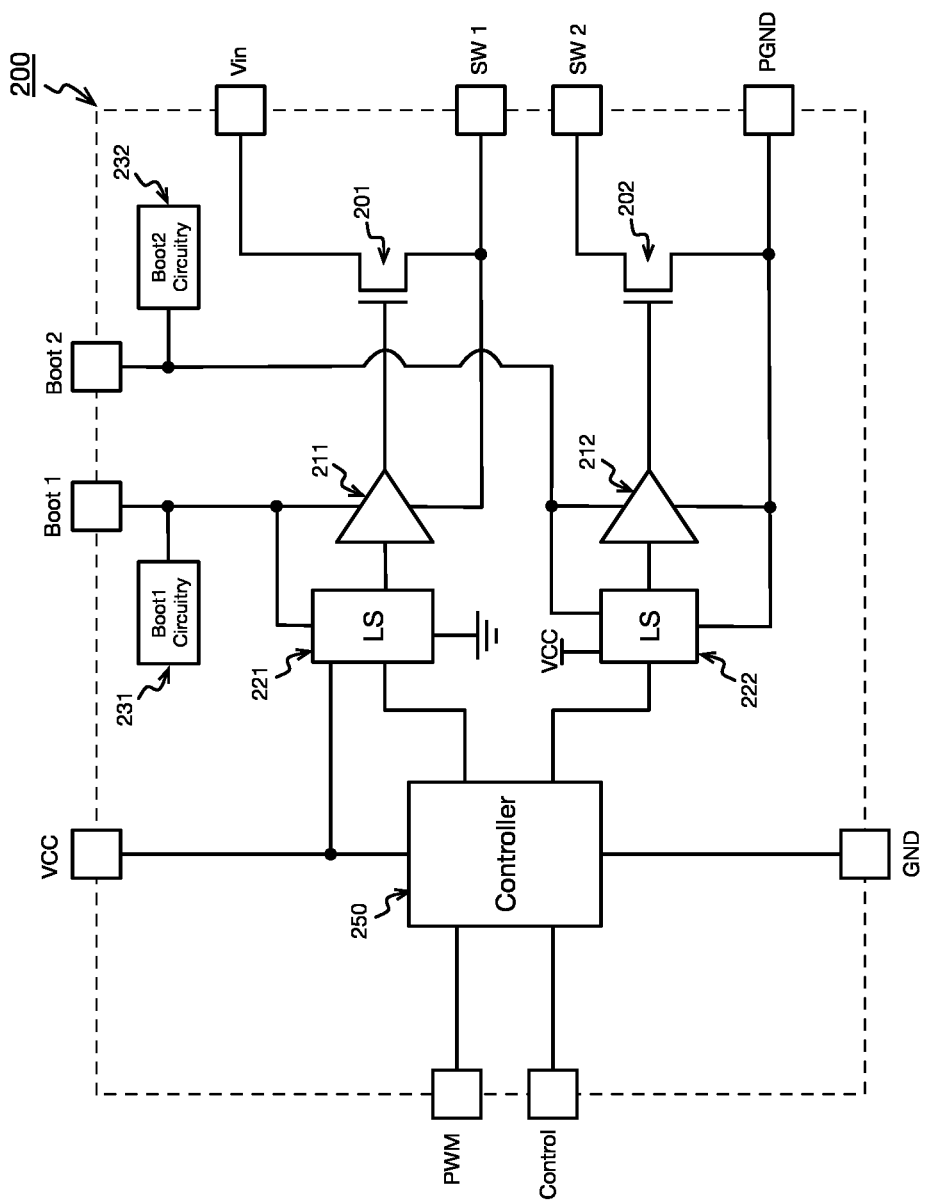
FIG. 2 depicts a schematic block diagram illustrating an example power semiconductor package in accordance with one or more embodiments.

FIG. 2 depicts a schematic block diagram illustrating an embodiment 200 of an example power semiconductor package directed to address, at least in part, needs for increased power density and/or higher power transfer in circumstances with limited real-estate and/or to address needs for increased efficiency at higher switching frequencies and/or at lower voltages, for example, and/or to address the potential shortcomings of DrMOS-type power semiconductor packages, such as power semiconductor package 100 and/or the like described above. Although power semiconductor package 200 may include some characteristics similar to those described and/or depicted in connection with example power semiconductor package 100, a number of differences may exist. For example, a power transfer path for power semiconductor package 200 may include a high-side switch 201 and a low-side switch 202. In an implementation, switches 201 and 202 may comprise power FETs, for example. "Power transfer path" as utilized herein refers to an electrically conductive path comprising one or more power switching devices, such as power FETS (e.g., switches 201 and/or 202). Also, as utilized herein, "power switching device," "power FET" and/or the like refer to switching devices capable of carrying relatively higher currents as compared with non-power-type switching devices (e.g., non-power FETs). Power switching devices may also be characterized, for example, by relatively higher switching speeds and/or by relatively lower "on" resistance. For example, in particular implementations, power switching devices, such as switches 201 and/or 202, may be capable of carrying multiple amperes of current, although subject matter is not limited in scope in this respect.

In an implementation, power semiconductor package 200 may include separate terminals SW1 and SW2 for high-side switch 201 and low-side switch 202, respectively, in contrast with the single switch terminal of power semiconductor package 100. Power semiconductor package 200 may also incorporate a first boot terminal Boot 1, along with associated boot circuitry 231, and a second boot terminal Boot 2, along with associated boot circuitry 232. Boot 1 terminal and/or Boot 2 terminal may be respectively and/or separately coupled to high-side and low-side driver circuits 211 and 212, for example. In particular implementations, first and second boot terminals Boot 1 and Boot 2 may also be respectively and/or separately coupled to high-side level shifter circuitry 221 and low-side level shifter circuitry 222. As noted above, DrMOS-type power semiconductor package 100 includes a single boot node. Further, the absence of low-side level shifter circuitry in DrMOS-type power semiconductor package 100 may also be noted as compared with the presence of low-side level shifter 222 in power semiconductor package 200, for example.

As discussed more fully below, implementations of multi-level power converters, multi-phase power converters and/or charge pump circuits, to name a few non-limiting examples, may utilize multiple power semiconductor packages, such as power semiconductor package 200, as building blocks for more sophisticated and/or larger circuit arrangements. Such implementations would not be possible with a DrMOS-type power semiconductor package, such as power semiconductor package 100, due at least in part to its single switch terminal SW shared by switches 101 and 102, its single boot terminal or its lack of low-side level shifter circuitry, or a combination thereof, for example. Also, for example, such implementations may not be possible with DrMOS-type power semiconductor packages due at least in part to DrMOS-type devices not working properly if terminal PGND is left floating (e.g., not connected to a ground reference voltage).

Power semiconductor package 200 may include a controller 250, for example. In an implementation, controller 250 may receive a timing reference signal (e.g., a clock signal) via terminal PWM, for example. In an implementation, controller 250 may also affect operation of high-side switch 201 and/or low-side switch 202 by way of providing signals to high-side level shifter 221 and/or low-side level shifter 222 and/or by providing signals to driver circuits 211 and/or 212, for example. Further, controller 250 may transmit and/or receive one or more signals via one or more control terminals. For example, controller 250 may communicate with one or more other power semiconductor packages via one or more control signals as discussed more fully below. Also, in some implementations, power semiconductor package 200 may communicate with an external controller via a PWM signal and/or via the control signals. In implementations, controller 250 may, for example, ensure dead time periods between periods of time when high-side switch 201 is conducting and when low-side switch 202 is conducting. That is, for example, controller 250 and/or other circuitry may wait a period time following disablement of one of switches 201 and 202 before enabling the other of switches 201 and 202 to ensure that at most only one of switches 201 and 202 are in a conductive, low impedance state at any given time.

As mentioned, implementations may include a controller, such as controller 250, located within a power semiconductor package, such as example power semiconductor package 200. However, in other implementations, an external controller may be utilized. Further, in some implementations, a combination of internal controller, such as controller 250, and an external controller may be utilized.

Further, although example power semiconductor package 200 is shown having two power switching devices (e.g., switches 201 and 202) and associated circuitry (e.g., driver circuits 211 and 212, level shifters 221 and 222, etc.), other power semiconductor packages may include more than two power switching devices or may include a single power switching device, as explained more fully below in connection with several example implementations. Also, in implementations, power semiconductor packages, such as example power semiconductor package 200, may include multiple semiconductor dies. For example, power switching devices (e.g., power FET) 201 and/or 202 may individually comprise separate integrated circuits and/or separate semiconductor dies. Further, for example, driver circuits 211 and/or 212 may comprise one or more semiconductor dies while power switching devices 201 and/or 202 may comprise one or more separate semiconductor dies. In an implementation, driver circuits 211 and/or 212 may share one or more semiconductor dies with other circuitry such as, for example, level shifters 221 and/or 222, boot circuitry 231 and/or 232, controller 250, etc.

Figure 3:
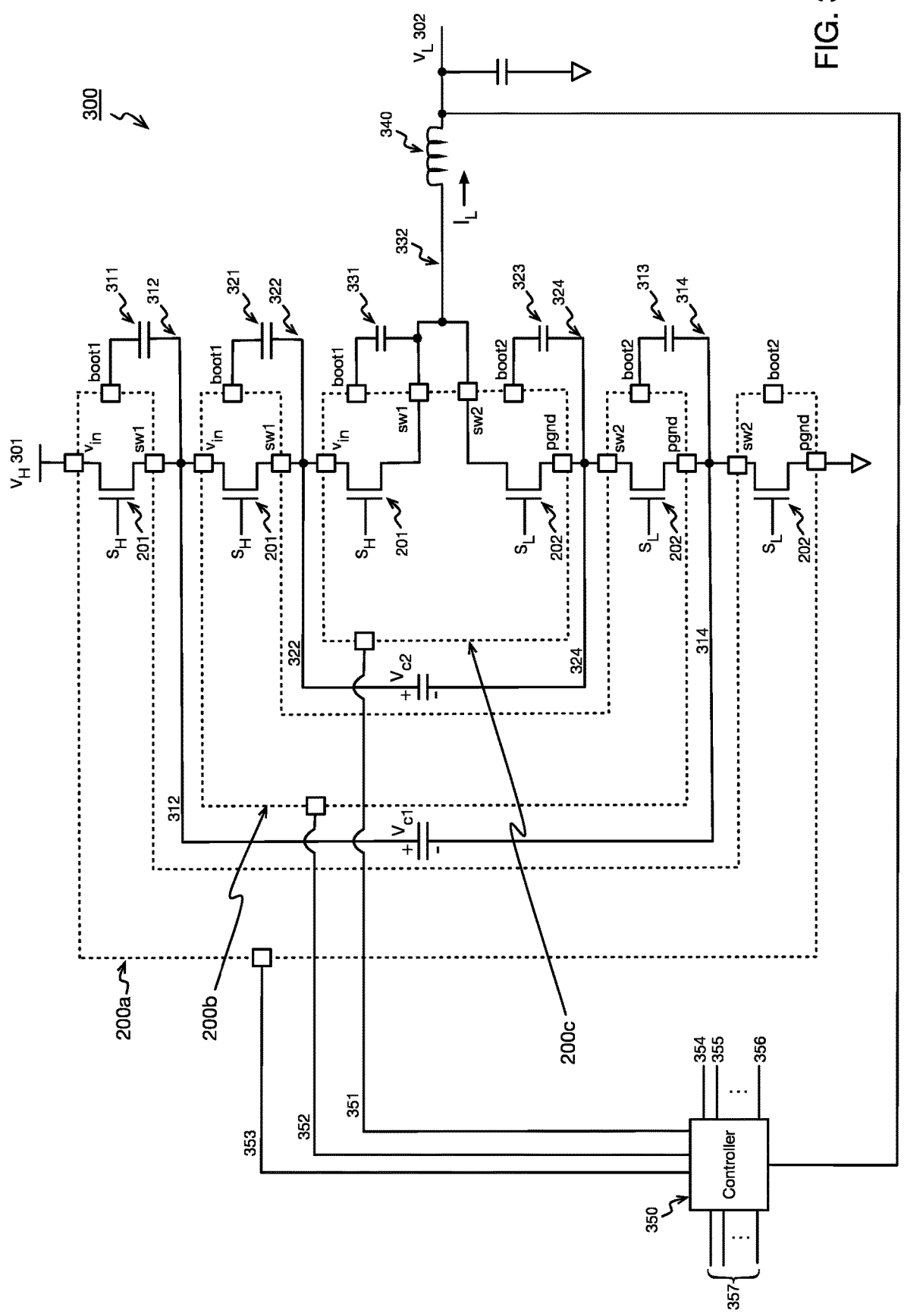
FIG. 3 depicts a schematic block diagram showing an example multi-level power converter including a plurality of example power semiconductor packages in accordance with one or more embodiments.

FIG. 3 depicts a schematic block diagram showing an embodiment 300 of an example multi-level power converter including a plurality of example power semiconductor packages. As depicted, multi-level power converter 300 may comprise several power semiconductor packages, such as power semiconductor packages 200a, 200b and 200c. In an implementation, power semiconductor packages 200a, 200b and 200c may respectively comprise different instances of example power semiconductor package 200, described above. For purposes of illustration, high-side switches (SH) 201 and low-side switches (SL) 202 for power semiconductor packages 200a, 200b and 200c are shown. However, other circuitry within power semiconductor packages 200a, 200b and 200c are not shown for the sake of clarity.

In an implementation, multi-level power converter 300 may comprise a four-level buck converter, although subject matter is not limited in scope in this respect. For example, although three power semiconductor packages 200a, 200b and 200c are depicted and/or described for multi-level power converter 300, other implementations may incorporate other numbers of power semiconductor packages.

As depicted in FIG. 3, a higher voltage node $V_H$ 301 may be coupled to a voltage-in ($V_{in}$) terminal of power semiconductor package 200a, in an implementation. Also, the $V_{in}$ terminal of power semiconductor package 200a may be coupled to a first node of high-side switch 201 of power semiconductor package 200a, for example. Further, in an implementation, a first switch terminal SW1 coupled to a second node of high-side switch 201 of power semiconductor package 200a may be coupled to a $V_{in}$ terminal of power semiconductor package 200b via node 312. Similarly, SW1 terminal of power semiconductor package 200b may be coupled to a $V_{in}$ terminal of power semiconductor package 200c via node 322, for example.

Additionally, in an implementation, a reference voltage terminal PGND coupled to a second node of low-side switch 202 of power semiconductor package 200c may be coupled to a second switch terminal SW2 of power semiconductor package 200b, and terminal PGND of power semiconductor package 200c may be coupled to terminal SW2 of power semiconductor package 200a, for example. Further, for in an implementation, PGND terminal of power semiconductor package 200a may be coupled to a reference voltage node, such as a ground reference node, for example. It may be noted that these example couplings between power semiconductor packages 200a, 200b and 200c are made possible at least in part due to the separate switch terminals SW1 and SW2 for the high-side and low-side switches, respectively. Also, the example couplings between power semiconductor packages 200a, 200b and 200c are made possible at least in part due to the PGND terminals of power semiconductor packages 200a, 200b and 200c not necessarily needing to be connected to a ground reference voltage as may be the case with a DrMOS-type power semiconductor package, such as power semiconductor package 100.

As mentioned, power semiconductor package 200 includes separate first and second boot terminals Boot 1 and Boot 2 rather than the single boot terminal provided by DrMOS-type power semiconductor package 100. Example multi-level power converter 300 makes use of the separate first and second boot terminals of power semiconductor packages 200a, 200b and 200c, in an implementation. For example, a capacitor 311 may be coupled between terminal Boot 1 and terminal SW1 of power semiconductor package 200a (e.g., via node 312). Further, in an implementation, a capacitor 321 may be coupled between terminal Boot 1 and terminal SW1 of power semiconductor package 200b (e.g., via node 322), and a capacitor 331 may be coupled between terminal Boot 1 and terminal SW1 of power semiconductor package 200c (e.g., via node 332).

Additionally, in an implementation, a capacitor 323 may be coupled between terminal Boot 2 and terminal PGND of power semiconductor package 200c (e.g., via node 324) and a capacitor 313 may be coupled between terminal Boot 2 and terminal PGND of power semiconductor package 200b (e.g., via node 314). Capacitors may also be coupled between node 312 and 314 and also between nodes 322 and 324, for example. Further, an inductor 340 may be coupled between node 332 (e.g., electrically coupled to SW1 and SW2 of power semiconductor package 200c) and a lower voltage node $V_L$ 302, in an implementation.

In an implementation, power semiconductor packages 200a, 200b and/or 200c may respectively include a controller, such as controller 250. For example implementation 300 depicted in FIG. 3, an external controller 350 may be provided in addition to and/or in place of controller 250. For example, in an implementation, controller 350 may provide one or more timing and/or control signals to power semiconductor packages 200a, 200b and/or 200c. Controller 350 may receive and/or transmit one or more signals 357, in an implementation. For example, controller 350 may receive a target output voltage parameter via signal(s) 357. Also, for example, controller 350 may receive one or more timing signals and/or one or more enable signals via signal(s) 357. Of course, subject matter is not limited in scope in these respects.

Also, in an implementation, controller 350 may monitor input voltage (e.g., $V_H$) via one or more signals 354 and/or may monitor current through inductor 340 via one or more signals 355. Controller 350 may also monitor voltage levels across one or more of the various capacitors (e.g., $V_{C1}$ and/or $V_{C2}$) and/or may monitor voltage level at one or more nodes (e.g., nodes 312, 322, 332, 324, 314, etc.), for example, via one or more signals 356. An output voltage (e.g., $V_L$) may also be monitored, for example. Again, subject matter is not limited in scope in these respects. Rather, these are merely examples of the types of communication that may occur between a controller, such as controller 350, and other devices within a power converter (e.g., power semiconductor devices 200a, 200b and/or 200c and/or other related circuitry) and/or external to a power converter (e.g., one or more external circuits, processors, etc.).

Although example multi-level power converter 300 is described herein and/or depicted in FIG. 3 as comprising a particular configuration of particular components and/or power semiconductor packages, subject matter is not limited in scope in these respects. Rather, a wide range of advantageous implementations are possible utilizing any number of power semiconductor packages having one or more characteristics similar to those of power semiconductor package 200, such as, for example, separate terminals for high-side and low-side switches, separate first and second boot terminals, or separate level shifter circuitry for high and low-side driver circuits, or a combination thereof. Further, implementations are possible wherein one or more power semiconductor packages have one or more characteristics that differ from one or more other power semiconductor packages, as discussed more fully below.

Figure 4:
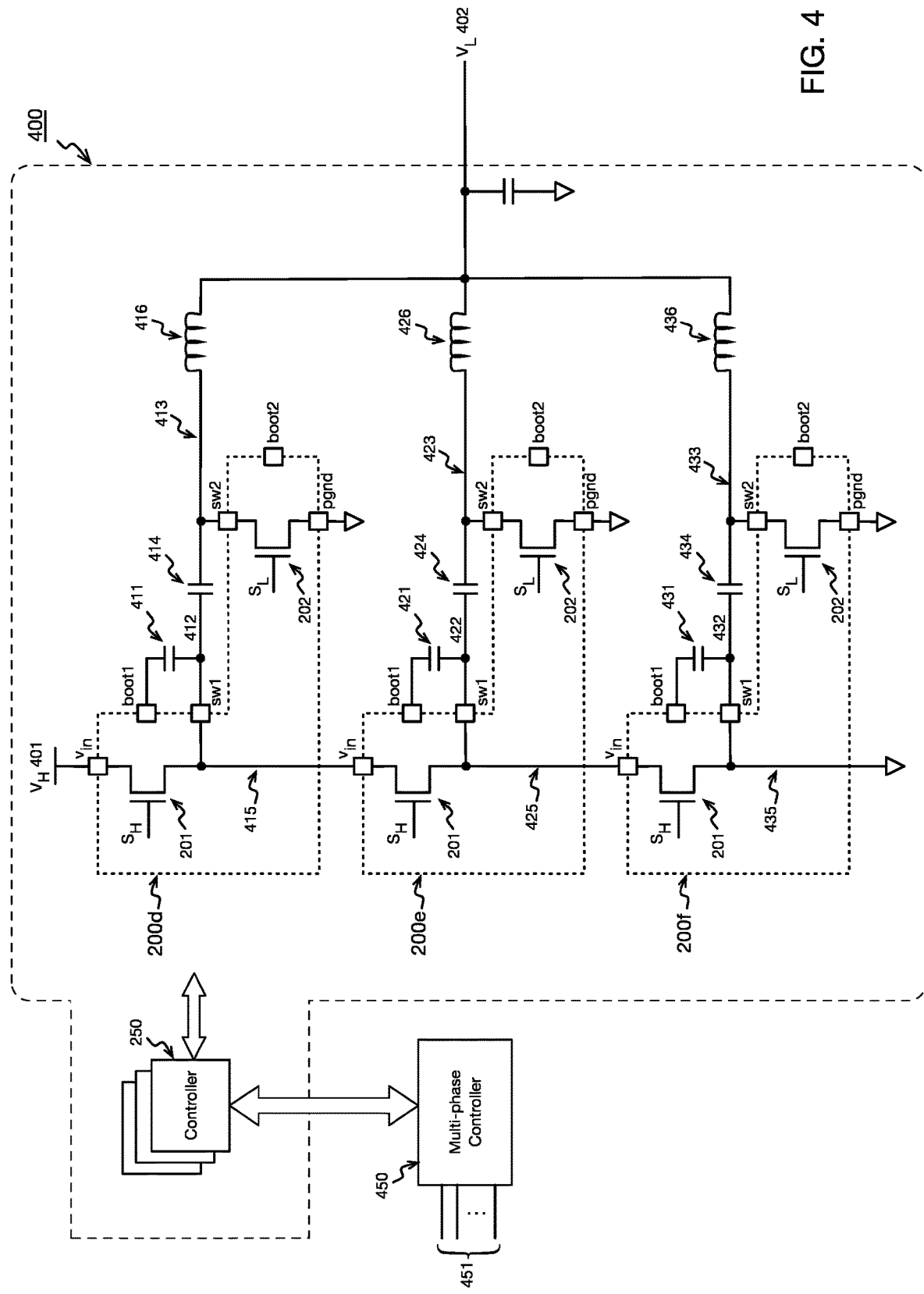
FIG. 4 depicts a schematic block diagram illustrating an example series-capacitor converter including a plurality of example power semiconductor packages in accordance with one or more embodiments.

FIG. 4 depicts a schematic block diagram illustrating an embodiment 400 of an example series-capacitor power converter including a plurality of example power semiconductor packages. As depicted, series-capacitor power converter 400 may comprise several power semiconductor packages, such as power semiconductor packages 200d, 200e and 200f. In an implementation, power semiconductor packages 200d, 200e and 200f may respectively comprise different instances of power semiconductor package 200. Again, for purposes of illustration, high-side switches (SH) 201 and low-side switches (SL) 202 for power semiconductor packages 200d, 200e and 200f are shown. However, other circuitry within power semiconductor packages 200d, 200e and 200f are not shown for the sake of clarity. In an implementation, series-capacitor power converter 400 may comprise a multi-phase series-capacitor buck converter, although subject matter is not limited in scope in this respect. For example, although three power semiconductor packages 200d, 200e and 200f are depicted and/or described for series-capacitor power converter 400, other implementations may incorporate other numbers of power semiconductor packages. Further, in an implementation, one or more power semiconductor packages, such as one or more of power semiconductor packages 200d, 200e and/or 200f, may have one or more characteristics that differ from one or more other power semiconductor packages.

In an implementation, a higher voltage node $V_H$ 401 may be coupled to a $V_{in}$ terminal of power semiconductor package 200d, in an implementation. Also, the $V_{in}$ terminal of power semiconductor package 200d may be coupled to a first node of high-side switch 201 of power semiconductor package 200d, for example. Further, in an implementation, a first switch terminal SW1 coupled to a second node of high-side switch 201 of power semiconductor package 200d may be coupled to a $V_{in}$ terminal of power semiconductor package 200e via node 415. Similarly, SW1 terminal of power semiconductor package 200e may be coupled to a $V_{in}$ terminal of power semiconductor package 200f via node 425, for example. A second node of high-side switch 201 of power semiconductor package 200f may be coupled to a reference voltage node, such as a ground reference node, for example.

Further, in an implementation, series-capacitor power converter 400 may include a capacitor 411 coupled between terminal Boot 1 and terminal SW1 of power semiconductor package 200d and may further include a capacitor 414 coupled between terminal SW1 and terminal SW2 of power semiconductor package 200d. Also, in an implementation, series-capacitor power converter 400 may include a capacitor 421 coupled between terminal Boot 1 and terminal SW1 of power semiconductor package 200e and may further include a capacitor 424 coupled between terminal SW1 and terminal SW2 of power semiconductor package 200e. Similarly, for example, a capacitor 431 may be coupled between terminal Boot 1 and terminal SW1 of power semiconductor package 200f and a capacitor 434 may be coupled between terminal SW1 and terminal SW2 of power semiconductor package 200f.

Additionally, in an implementation, an inductor 416 may be coupled between terminal SW2 (e.g., node 413) of power semiconductor package 200d and a lower voltage node $V_L$ 402, in an implementation. Further, an inductor 426 may be coupled between terminal SW2 (e.g., node 423) of power semiconductor package 200e and $V_L$ 402 and an inductor 436 may be coupled between terminal SW2 (e.g., node 433) of power semiconductor package 200f and $V_L$ 402.

As mentioned, series-capacitor power converter 400 may comprise a multi-phase converter, for example. In particular implementations, series-capacitor power converter 400 may comprise a number (e.g., two, three, four, etc.) paralleled power transfer paths (e.g., implemented via power semiconductor devices 200d, 200e and/or 200f) which may drive a common load (e.g., such as may exist at $V_L$ 402).

In an implementation, power semiconductor packages 200d, 200e and/or 200f may respectively include a controller 250. Other implementations may omit controller(s) 250. In a particular implementation, an external controller 450 may comprise a multi-phase controller tasked, at least in part, to control operation of the various phases of series-capacitor power converter 400. In an implementation, control and/or timing signals may be provided to power semiconductor packages 200d, 200e and 200f from multi-phase controller 450 or from controller(s) 250, or a combination thereof. In an implementation, individual power transfer paths (e.g., implemented via power semiconductor packages 200d, 200e and/or 200f) of series-capacitor power converter 400 may be out of phase with each other. For example, one phase (e.g., as implemented via power semiconductor package 200d) may be opening a switch while another phase (e.g., as implemented via power semiconductor package 200e) may be closing a switch. Dead time periods between phases may also be enforced via external controller 450 and/or controller(s) 250, in an implementation. For a three-phase example, control signals for individual phases of series-capacitor power converter 400 may have timings that are rotated 120° and/or 240° as compared with timing signals of other phases. Also, in an implementation, power semiconductor packages 200d, 200e and 200f may operate at the same clock frequency.

Controller 450 may further receive and/or transmit one or more signals 451, in an implementation. For example, controller 450 may receive target output voltage parameter via signal(s) 451. Also, for example, controller 450 may receive one or more timing signals, enable signals and/or other types of control signals via signal(s) 451. Of course, subject matter is not limited in scope in these respects.

In implementations, multi-phase operation may provide a number of advantages and/or benefits. For example, due at least in part to current draw being spread out across the various phases within a switching cycle, output current ripple and/or voltage ripple may be reduced at least in part in proportion to the number of phases. Further, for example, a reduction in instantaneous current draw may result in a reduction in ripple noise injected back into the supply. In an implementation, multi-phase operation of series-capacitor power converter 400, for example, may result in improved efficiency as compared to single phase operation at a given switching frequency. Further, for example, multi-phase operation of series-capacitor power converter 400 may result in an improved response to output load changes and/or may provide improved transient response. At least some of advantages of a multi-phase implementation, such as example multi-phase series-capacitor power converter 400, may become more evident for circuits designed for higher current output (e.g., greater than 10 amperes). However, at least some benefits may be realized for lower current circuits including, for example, specification of smaller input and/or output filter capacitors. Additionally, due at least in part to the modular approach to power converter implementation made possible through utilization of power semiconductor packages such as example power semiconductor packages 200*d*, 200*e* and/or 200*f*, multi-phase series-capacitor power converters may be implemented more quickly, efficiently, economically, etc., while avoiding at least some of the inherent drawbacks and/or disadvantages of custom integrated circuit solutions and/or of discrete implementations, for example. Of course, these are merely example advantages and/or benefits that may be realized from multi-phase operation of series-capacitor power converter 400 and/or from a modular implementation utilizing power semiconductor packages 200*d*, 200*e* and/or 200*f*, for example, and subject matter is limited in scope in these respects.

Although example series-capacitor power converter 400 is described herein and/or depicted in FIG. 4 as comprising a particular configuration of particular components and/or power semiconductor packages, subject matter is not limited in scope in these respects. Rather, a wide range of advantageous implementations are possible utilizing any number of power semiconductor packages having one or more characteristics similar to those of power semiconductor package 200, such as, for example, separate terminals for high-side and low-side switches, separate first and second boot terminals, or separate level shifter circuitry for high and low-side driver circuits, or a combination thereof. Further, implementations are possible wherein one or more power semiconductor packages have one or more characteristics that differ from one or more other power semiconductor packages, as discussed previously and as discussed more fully below.

As seen in FIGS. 3 and/or 4 and/or as may be gleaned from the discussion above, various power converter topologies may be implemented utilizing one or more power semiconductor packages as building blocks. This modular/building-block approach may provide at least some of the advantages of custom/bespoke integrated circuit implementations wherein all or substantially all of the power converter circuitry is formed on a semiconductor die while avoiding the disadvantages of difficulty of design, manufacturing time and cost, etc. The modular/building-block approach described herein may also yield at least some of the advantages of discrete implementations while, again, avoiding at least some of the disadvantages.

As mentioned, in implementations, power semiconductor packages such as power semiconductor package 200 may comprise a controller, such as controller 250. As also mentioned, a controller of one power semiconductor package may communicate with logic circuitry and/or controllers of one or more other power semiconductor packages. In some implementations, a particular power semiconductor package may include a relatively more powerful and/or more full featured controller and one or more other power semiconductor packages may include more simple and/or less full featured control circuitry. For example, a controller, such as controller 250 as shown in FIG. 2, of a particular power semiconductor package may provide control signals to one or more other power semiconductor packages to implement various operations and/or to affect operation of the high-side and/or low-side switches of the various power semiconductor packages. In other implementations, multiple power semiconductor packages may include controllers, such as controller 250, that may communicate with each other to implement various operations and/or to affect operation of the high-side and/or low-side switches of the various power semiconductor packages. In an implementation, controller 250 of power semiconductor package 200, for example, may communicate with one or more other power semiconductor packages via an interface substantially compliant with and/or substantially compatible with an $I^2C$-type interface (e.g., $I^2C$-bus specification, rev 6, Apr. 4, 2014) and/or via any of a wide range of digital and/or analog communication protocols. As also discussed above, some implementations may utilize an external controller, such as controller 450, in addition to or in place of controller(s) 250. An external controller, such as controller 450, may communicate with controller(s) 250 and/or may otherwise communicate with one or more power semiconductor packages, such as power semiconductor package 200, via an $I^2C$-type interface and/or via any of a wide range of digital and/or analog communication protocols.

In an implementation, multiple power semiconductor packages, such as power semiconductor package 200, may communicate with each other via a wired-or signal. For example, a "power good" or other signal may be coupled between and/or among the various control signal terminals of multiple power semiconductor packages. In an implementation, the power good signal may be tied to a logically high voltage via a resistor. In response to a fault condition, for example, any of the multiple power semiconductor packages may pull the power good signal to a logically low voltage level, thereby signaling the fault condition to the other power semiconductor packages. In an implementation, controller 250 may initiate a shut-down operation for power semiconductor package 200 in the event of a fault condition, for example.

In an implementation, a controller, such as controller 250, of a particular power semiconductor package, such as power semiconductor package 200*a* of FIG. 3, for example, may communicate with one or more other power semiconductor packages such as power semiconductor packages 200*b* and 200*c*, for example, to implement a plurality of modes of operation such as, for example, a normal operation mode, a start-up mode, a shut-down mode or a sleep mode, or any combination thereof. For another example, power semiconductor package 200*d* of FIG. 4, for example, may communicate with one or more other power semiconductor packages such as power semiconductor packages 200*e* and 200*f*, for example, to implement the plurality of modes of operation.

In an implementation, controller 250 of power semiconductor package 200a, for example, may signal a shut-down mode to power semiconductor packages 200b and/or 200c responsive at least in part to a fault detection and/or to a temperature event detection, to name just a couple non-limiting examples. In an additional implementation, controller 250 of power semiconductor package 200a, for example, may signal a start-up mode of operation to power semiconductor packages 200b and/or 200c at least in part to pre-charge one or more capacitors within power semiconductor packages 200b and/or 200c. Further, in an implementation, controller 250 of power semiconductor package 200a, for example, may signal a sleep mode of operation to one or more of power semiconductor packages 200b and/or 200c, for example, at least in part to maintain a specified charge on one or more capacitors of power semiconductor packages 200b and/or 200c.

In particular implementations, by incorporating relatively intelligent independent autonomous individual controllers in one or more power semiconductor packages, such as power semiconductor package 200, an end user may be relieved of the responsibility and/or need to understand details of the various workings of the power semiconductor packages due at least in part to the functionality built in to the power semiconductor package. Thus, it may become easier to design and/or implement different solutions. For other systems, such as may utilize DrMOS-type power semiconductor packages such as power semiconductor package 100, an external controller may be needed to synchronize and/or control the various power semiconductor packages, which may require a custom implementation. Again, it may be seen that the modular approach made possible by the various example characteristics of power semiconductor package 200 discussed above, for example, lends itself to ease of use, versatility, customization, economies of scale, etc.

Figure 5:
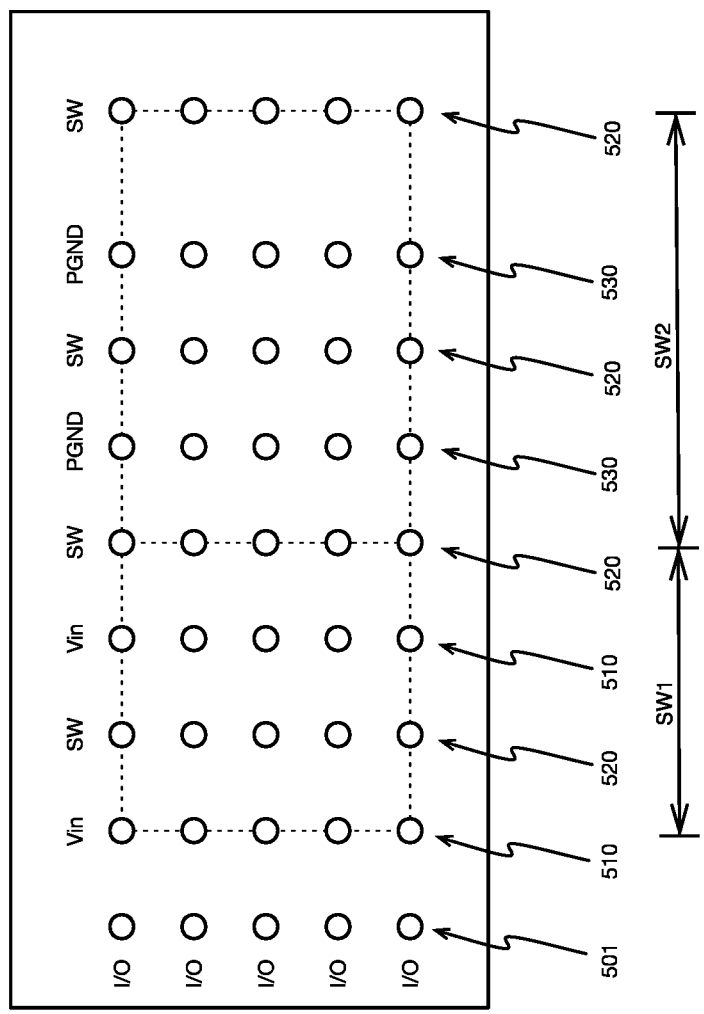
FIG. 5 is an illustration of an example ball grid array for an example power semiconductor package in accordance with one or more embodiments.

FIG. 5 is an illustration of an example ball grid array (BGA) 500 for an example DrMOS-type power semiconductor package, such as power semiconductor package 100. In an implementation, solder pads 501 may comprise terminals for one or more input and/or output signals, such as one or more control and/or timing signals. For example, solder pads 501 may comprise a PWM terminal and/or a Boot terminal for power semiconductor module 100, in an implementation. Further, in an implementation, multiple columns of solder pads 510 may collectively comprise a $V_{in}$ terminal, wherein the multiple solder pads are provided in order to accommodate higher currents that may be associated with terminal $V_{in}$ of power semiconductor package 100. As discussed above, terminal $V_{in}$ may be coupled to a first node of high-side switch (SW1) 101 of power semiconductor package 100. Similarly, multiple columns of solder pads 530 may collectively comprise terminal PGND of power semiconductor package 100, wherein, again, the multiple solder pads are provided to accommodate higher current specifications for terminal PGND. As discussed above, terminal PGND may be coupled to a second node of low-side switch (SW2) 102 of power semiconductor package 100.

Example BGA 500 also includes one or more columns of solder pads 520 to collectively comprise switch terminal SW of power semiconductor package 100, in an implementation. As seen in FIG. 1, and as discussed above, terminal SW of power semiconductor package 100 may be coupled to a second node of high-side switch (SW1) 101 and may also be coupled to a first node of low-side switch (SW2) 102 of power semiconductor package 100. Solder pads for supply voltages (e.g., VCC, GND) are not depicted for clarity of discussion. However, in implementations, multiple solder pads may be provided to accommodate supply voltages and/or other signal types (e.g., boot), and subject matter is not limited in scope in these regards.

Figure 6:
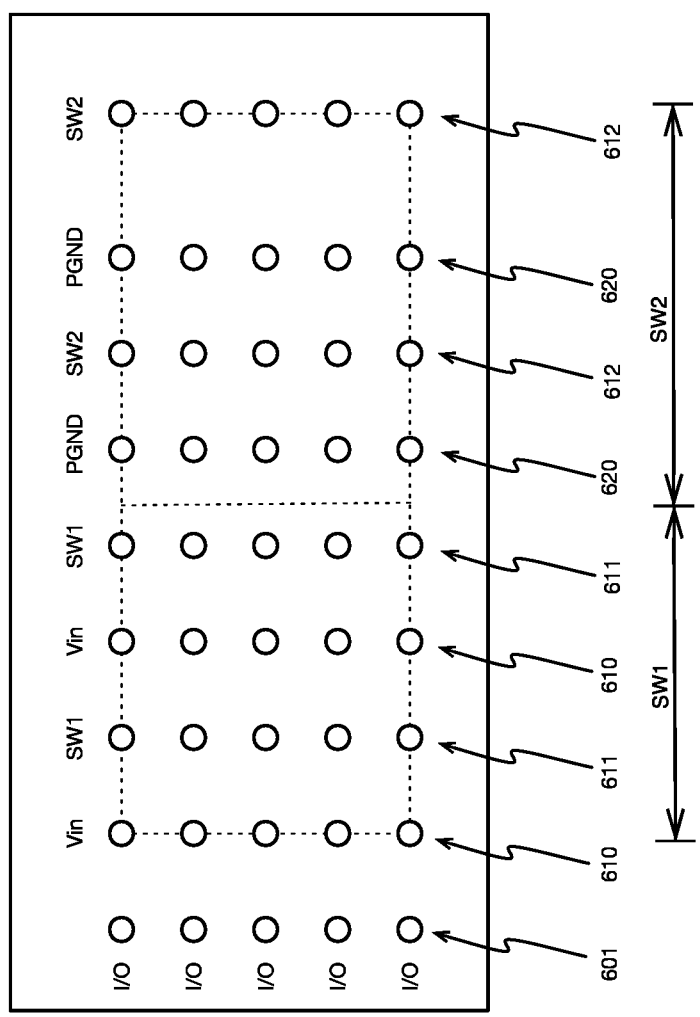
FIG. 6 is an illustration of an example ball grid array for an example power semiconductor package in accordance with one or more embodiments.

FIG. 6 depicts an embodiment 600 of an example BGA for an example power semiconductor package, such as power semiconductor package 200. As with example BGA 500, multiple solder pads may comprise terminals for various signals and/or voltages. For example, solder pads 601 may comprise boot 1 and/or boot 2 terminals. Further, solder pads 601 may comprise a PWM terminal and/or a timing reference (e.g., SYNCH) terminal, for example. Also, in an implementation, multiple columns of solder pads 610 may collectively comprise a $V_{in}$ terminal. In an implementation, multiple solder pads may be provided to accommodate higher currents that may be associated with terminal $V_{in}$ of power semiconductor package 200. Further, as discussed above, terminal $V_{in}$ may be coupled to a first node of high-side switch (SW1) 201 of power semiconductor package 200. Similarly, multiple columns of solder pads 630 may collectively comprise terminal PGND of power semiconductor package 200, wherein, again, the multiple solder pads are provided to accommodate higher current conditions. As noted above, terminal PGND may be coupled to a second node of low-side switch (SW2) 202 of power semiconductor package 200. In FIG. 6, solder pads for supply voltages (e.g., VCC, GND) are not depicted for clarity of discussion. However, in implementations, multiple solder pads may be provided to accommodate supply voltages and/or other signal types, for example, and subject matter is not limited in scope in these regards.

As noted above, example BGA 500 includes one or more columns of solder pads 520 to collectively comprise switch terminal SW of power semiconductor package 100, in an implementation. For example BGA 600, however, multiple columns of solder pads 611 may comprise high-side switch terminal SW1 and another separate multiple columns of solder pads 612 may comprise low-side switch terminal SW2 of power semiconductor package 200. As discussed above, separate terminals for high-side and low-side switches provide a great deal of flexibility and/or utility and/or may allow for the implementation of a much wider variety of power converter arrangements than would be possible with single switch terminal-type power semiconductor packages, such as example DrMOS-type power semiconductor package 100.

In particular implementations, sizes of a power switching devices within a semiconductor package, such as power semiconductor package 600, may be specified based at least in part on characteristics related to efficiency, on-resistance ($R_{on}$) and/or parasitic capacitance for given current and/or switching frequency characteristics. For example, larger power switching devices may tend to have lower on-resistance but higher parasitic capacitance. Also, for example, higher output current capabilities may require larger power switching devices (e.g., power FETs) in order to reduce conductions loss ($I_{RMS}^2 * R_{on}$). Also, for example, higher switching frequency may allow the use of smaller power switching devices resulting in reduced parasitic capacitance loss ($\frac{1}{2}C*V^2*freq$). In implementations, a size of a particular power switching device may be specified in a manner that strikes an appropriate and/or advantageous balance among characteristics of efficiency, on-resistance and/or parasitic capacitance given a particular application.

In some implementations, power switching device sizes may be specified differently from one device to the next to accommodate different load current specifications, for example. Power switching device sizes may also be specified at least in part as a function of a particular topology a particular power semiconductor package, such as power semiconductor package 600, is intended to operate. For a multi-level converter topology, for example, power switching devices within a power semiconductor package, such as power semiconductor package 600, may be specified to have the same size. In a series-capacitor buck arrangement, for another example, it may be advantageous to specify a low-side power switching device to be larger in size than a high-side power switching device due at least in part to a difference in "on" time between the low-side and high-side devices (e.g., low-side power switching device may be "on" longer than high-side power switched device assuming a conversion ratio of at least 2:1). Of course, subject matter is not limited in scope in these respects.

Figure 7:
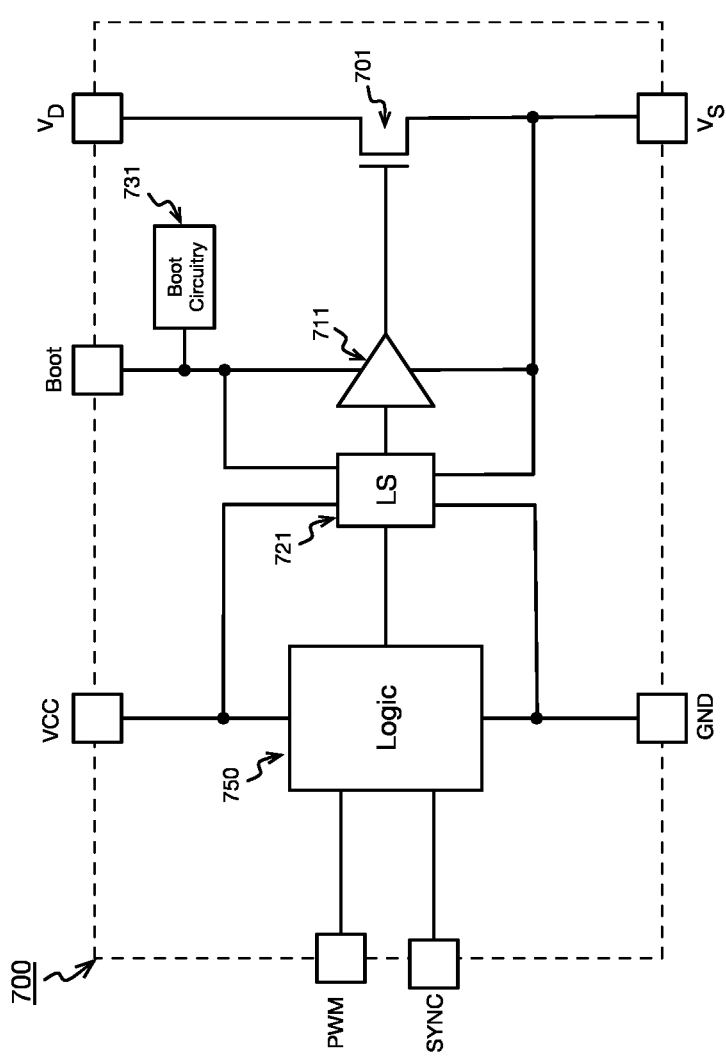
FIG. 7 depicts a schematic block diagram of an example power semiconductor package in accordance with one or more embodiments.

FIG. 7 depicts a schematic block diagram of an embodiment 700 of an example power semiconductor package. In an implementation, power semiconductor package 700 may comprise another building block that may be utilized to implement a variety of power converter arrangements. For example, power semiconductor package 700 may include a power field-effect transistor (FET) 701 coupled between voltage terminals $V_D$ and $V_S$. Driver circuitry 711 may be coupled to a control node of power FET 701. Level shifter circuitry 721 may receive one or more control signals from logic circuitry 750 and/or may provide one or more signals to driver circuitry 711. A boot terminal may also be provided, for example, along with associated boot circuitry 731. Terminals for supply voltage (e.g., VCC) and/or reference voltage (e.g., GND) may also be included, in an implementation. Further, in an implementation, a timing signal terminal (e.g., PWM) and/or one or more control signals (e.g., SYNC) may also be provided. As discussed more fully below, building blocks such as power semiconductor package 700 may be designed and/or manufactured with particular characteristics in mind. Various attributes of power semiconductor 700 may be specified to achieve particular design goals, for example.

Figure 8:
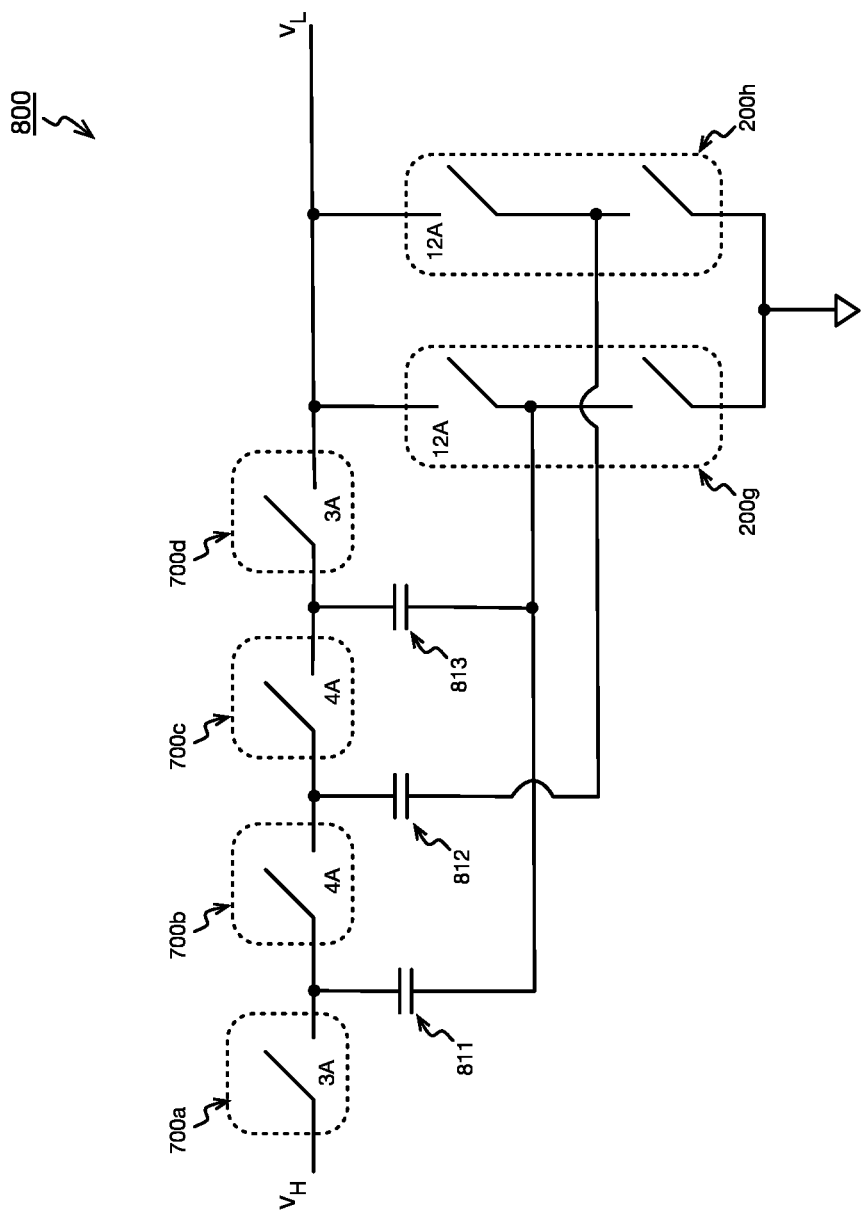
FIG. 8 depicts a schematic block diagram showing an example charge pump arrangement including a plurality of example power semiconductor packages in accordance with one or more embodiments.

FIG. 8 depicts a schematic block diagram illustrating an embodiment 800 of an example charge pump arrangement including a plurality of example power semiconductor packages. In an implementation, a first plurality of power semiconductor packages, such as power semiconductor packages 700a, 700b, 700c and/or 700d may be coupled substantially in series via one or more intermediate voltage nodes between a higher voltage node $V_H$ and a lower voltage node $V_L$. In an implementation, power semiconductor packages 700a, 700b, 700c and/or 700d may comprise instances of power semiconductor package 700. However, in an implementation, power semiconductor packages 700a and 700d may be specified to comprise 3 A (ampere) power transfer paths and power semiconductor packages 700b and 700c may be specified to comprise 4 A (ampere) power transfer paths. In an implementation, different current handling characteristics may be based, at least in part, on the sizes, materials and/or construction for power FETs, such as power FET 701, for example. Further, in an implementation, power switching devices within power semiconductor packages 700b and 700c may have voltage rating parameters twice that of power semiconductor packages 700a and 700d, for example.

In an implementation, example charge pump arrangement 800 may include a second plurality of power semiconductor packages, such as power semiconductor packages 200g and 200h, coupled substantially in parallel between node $V_L$ and a reference voltage node, as depicted in FIG. 8. In an implementation, power semiconductor packages 200g and 200h may individually comprise power transfer paths including a high-side switch and a low-side switch, wherein a first node of the high-side switch may be coupled to node $V_L$ and wherein a second node of the low-side switch may be coupled to the reference voltage node. Further, in an implementation, capacitors 811, 812 and/or 813 may be coupled between one or more of power semiconductor packages 200g and/or 200h and one or more of the intermediate nodes between power semiconductor packages 700a, 700b, 700c and/or 700d, as depicted in FIG. 8, for example. Of course, subject matter is not limited in scope in these respects.

In an implementation, power semiconductor packages 200g and/or 200h may comprise 12 A (ampere) power transfer paths. For example charge pump arrangement 800 depicted in FIG. 8, multiple types of power semiconductor packages are utilized. For example, power semiconductor packages 700a, 700b, 700c and 700d comprise single power FET power semiconductor packages such as described above in connection with example power semiconductor package 700 while power semiconductor packages 200g and 200h comprise power semiconductor packages incorporating power transfer paths having high-side and low-side switches and separate high-side and low-side switch terminals. Additionally, for the current example implementation, power semiconductor packages 700a and 700d comprise 3 A (ampere) power transfer paths while power semiconductor packages 700b and 700c comprise 4 A (ampere) power transfer paths having voltage rating characteristics that may be twice that of power semiconductor packages 700a and 700d, for example. Thus, it can be seen that different implementations of the example power semiconductor package types described herein may be utilized as modular building blocks to develop larger power converter arrangements. Different building blocks may be specified depending on particular applications, for example.

In particular implementations, a power converter may include a plurality of power semiconductor packages. In implementations, one or more power semiconductor packages may be substantially formed of a particular material and/or may be manufactured using a particular process while one or more other power semiconductor packages may be substantially formed of substantially different material and/or may be manufactured using a substantially different process. In this manner, a variety of power semiconductor package building blocks may be implemented according to particular specifications for particular applications. For example, in an implementation, one or more power semiconductor packages may include one or more silicon-based integrated circuits and/or one or more additional power semiconductor packages may include one or more integrated circuits substantially formed from III-V semiconductors, such as gallium arsenide or gallium nitride, or a combination thereof, for example. Further, for example, one or more power semiconductor packages may include one or more integrated circuits comprising a first plurality of metal layers and one or more other power semiconductor packages may include one or more integrated circuits comprising a second plurality of metal layers, wherein the first plurality of metal layers exceeds the second plurality of metal layers, in an implementation. Further, different integrated circuits within a particular power semiconductor package may be formed utilizing different materials, different processes and/or utilizing different numbers of metal layers, for exam pie.

For example, power FET 701 of example power semiconductor package 700 may be manufactured using different materials, processes and/or numbers of metal layers as compared with logic circuit 750, level shifter 721, etc. Similarly, in an implementation, a power transfer path including high-side switch 201 and/or low-side switch 202 of example power semiconductor package 200 may be manufactured using different materials, processes and/or numbers of metal layers as compared with the materials, processes and/or numbers of metal layers utilized to manufacture controller 250, for example.

In FIGS. 9-12, various switching devices (e.g., power FETs) may be labelled with an integer "1" or an integer "2." These integers are meant to represent different states (or phase) in a particular switched capacitor (or charge pump) power converter arrangement. Thus, for example, switching devices labelled "1" may be enabled during a first switching state and switching devices labelled "2" may be enabled during a second switching state, in an implementation. Of course, implementations are not limited to two-state implementations, as discussed previously.

Figure 9:
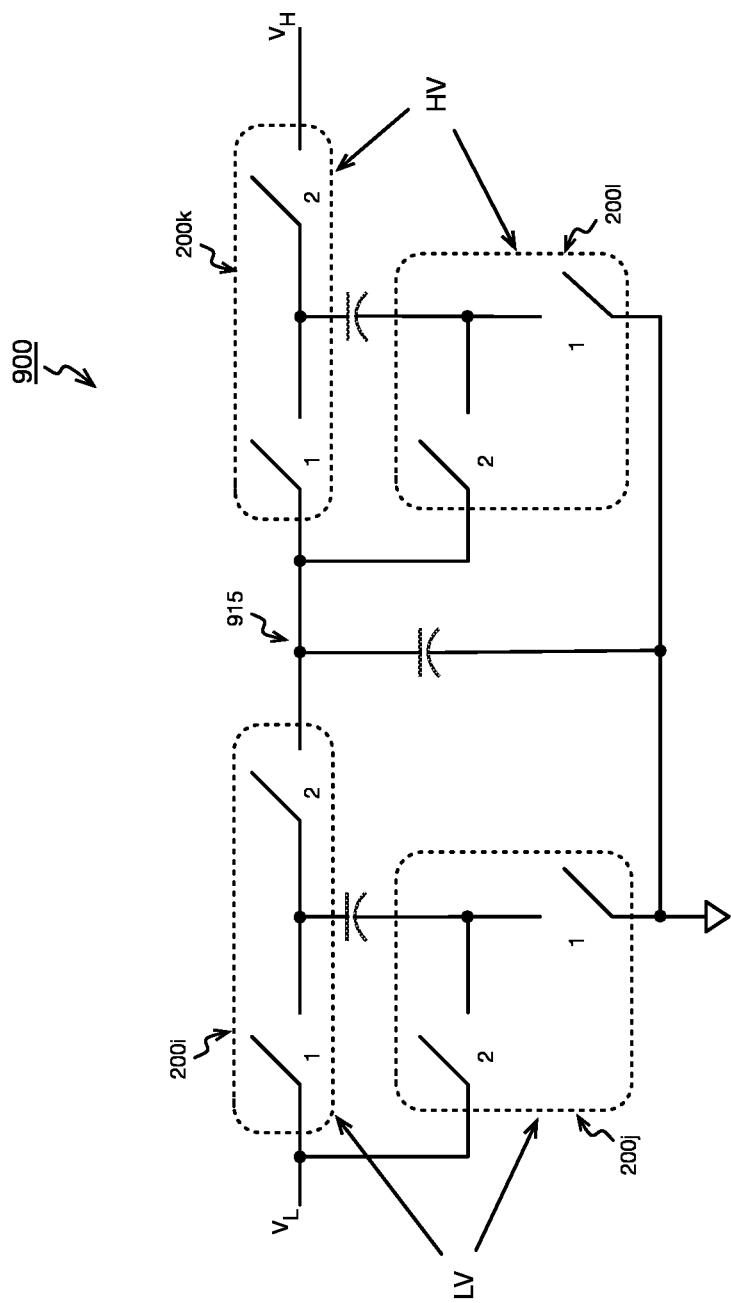
FIG. 9 depicts a schematic block diagram illustrating an example charge pump arrangement including a plurality of example power semiconductor packages in accordance with one or more embodiments.

FIG. 9 depicts a schematic block diagram illustrating an embodiment 900 of an example charge pump arrangement including a plurality of example power semiconductor packages. In an implementation, charge pump arrangement 900 may comprise an example "doubler" arrangement in that individual pairs of power semiconductor packages may double an amount of input voltage. For example, power semiconductor packages 200i and 200j may collectively form a first doubling stage and power semiconductor packages 200k and 200l may collective form a second doubling stage. In an implementation, power semiconductor packages 200i, 200j, 200k and/or 200l may comprise at least some characteristics similar to those discussed above in connection with power semiconductor package 200.

In an implementation, given an input voltage of 1V at lower voltage node $V_L$, a voltage level of 2V may be formed at intermediate node 915 and a voltage level of 4V may be formed at output node $V_H$. In other implementations, a single pair of power semiconductor packages may be utilized to implement a single doubling stage (e.g., to produce 2V from a 1V input). Further, more than two pair of power semiconductor packages may be utilized to generate different multiples of an input voltage. For example, if a third pair of power semiconductor packages where to be added to the configuration of example 900 to form a third doubling stage, an 8V output may be generated from a 1V input voltage. A fourth pair of power semiconductor packages may form a fourth doubling stage to generate a 16V output from a 1V input, for example.

In implementations, different pairs of power semiconductor packages, such as a lower voltage (LV) pair formed by power semiconductor packages 200i and 200j and/or a higher voltage (HV) pair formed by power semiconductor packages 200k and 200l, may be rated to handle different voltage and/or current levels. For example, given a 1V input voltage at node $V_L$, the lower voltage pair formed by power semiconductor packages 200i and 200j may include switching devices (e.g., power FETs) designed and/or implemented to handle 1V. Also, for example, given the 1V example voltage level at input node $V_L$, the higher voltage (HV) pair formed by power semiconductor packages 200k and 200l may include switching devices (e.g., power FETs) designed and/or implemented to handle 2V. Thus, for example, LV power semiconductor devices 200i and/or 200j may comprise characteristics of a first particular implementation of power semiconductor device 200 and/or HV power semiconductor devices 200k and/or 200l may comprise characteristics of a second particular implementation of power semiconductor device 200, for example. Again, it may be seen that different implementations of the example power semiconductor package types described herein may be utilized as modular building blocks to develop more involved power converter arrangements. It may be noted that a DrMOS-type device, such as power semiconductor package 100, would not function properly in the example configuration of example 900 due at least in part to the PGND terminal of the DrMOS device needing to be tied to a ground voltage reference. For example, in example charge pump arrangement 900, neither of the switching devices of power semiconductor package 200i and/or of power semiconductor package 200k are ground-referenced.

Figure 10:
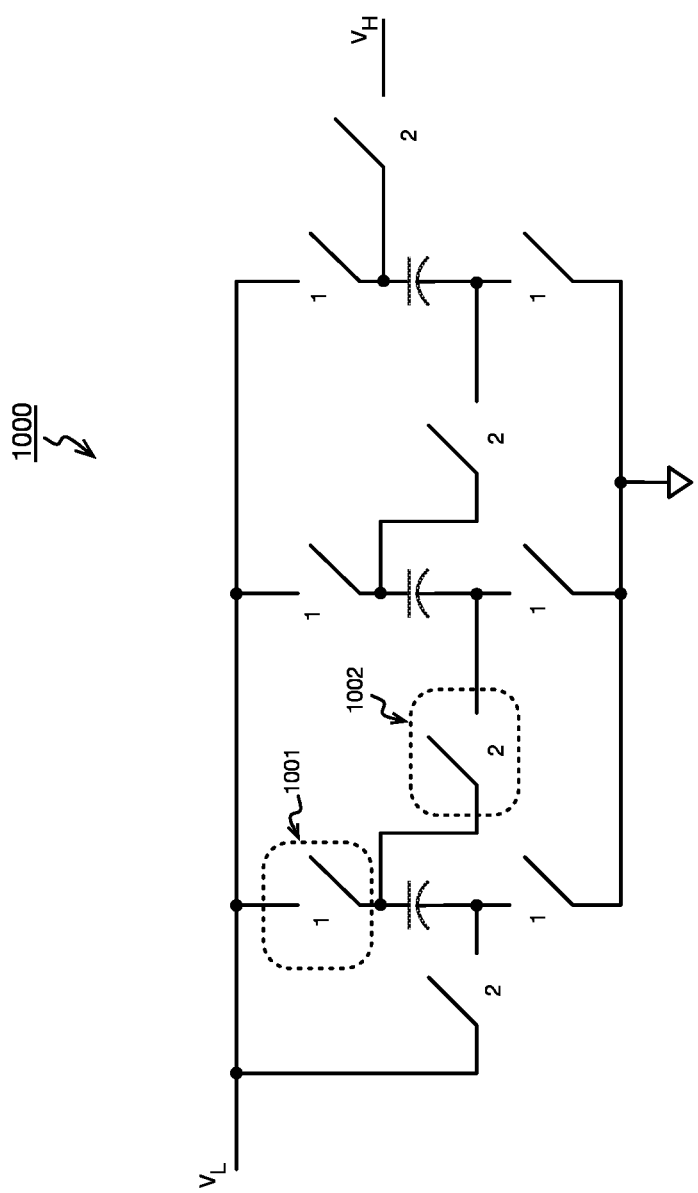
FIG. 10 depicts a schematic block diagram illustrating an example series-parallel power converter arrangement in accordance with one or more embodiments.

FIG. 10 depicts a schematic block diagram illustrating a series-parallel power converter arrangement 1000 including a number of switching devices, including switching devices 1001 and 1002. For example series-parallel power converter arrangement 1000, a modular approach to implementation may be problematic due at least in part to the various switching devices (e.g., power FETs) of arrangement 1000 having different voltage and/or current specifications. For example, switching device 1001 may have different specified voltage and/or current characteristics than switching device 1002. The same may hold true for one or more of the other several switching devices illustrated in example series-parallel arrangement 1000. For a modular approach to work, at least some of the power switching devices of example arrangement 1000 would have to be over-rated to ensure reliable operation. Thus, at least some benefits and advantages of modularization may be lost. However, other implementations are possible utilizing a modular approach, as described below.

Figure 11:
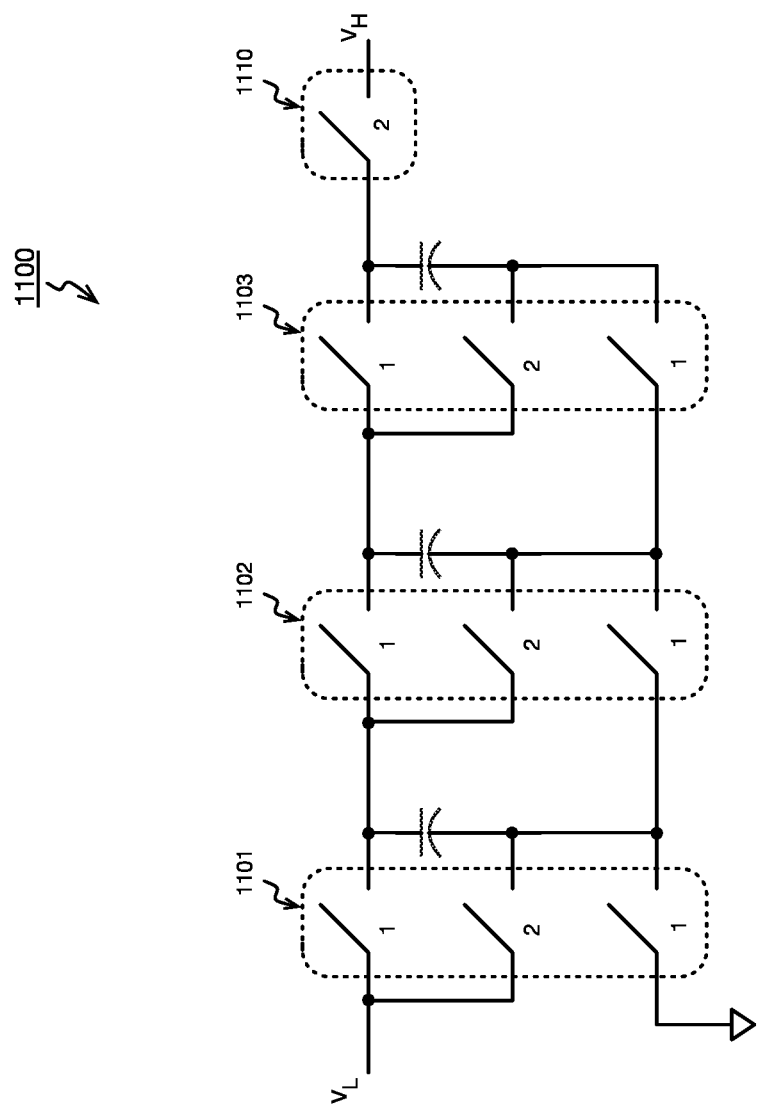
FIG. 11 depicts a schematic block diagram illustrating an example series-parallel power converter arrangement utilizing power semiconductor packages in accordance with one or more embodiments.

FIG. 11 depicts a schematic block diagram illustrating an example series-parallel power converter arrangement 1100 implemented utilizing several power semiconductor packages in a more modular approach. For example, series-parallel power converter arrangement 1100 may include several power semiconductor packages 1101, 1102 and/or 1103 connected in a substantially series fashion, wherein the individual power semiconductor packages 1101, 1102 and/or 1103 individually include substantially parallel-connected switching devices (e.g., power FETs). Several capacitors are also coupled in a substantially parallel fashion, as depicted. Additionally, in an implementation, a single switching device power semiconductor package 1110 may also be coupled to the other power semiconductor packages in a substantially series fashion, as depicted.

In an implementation, power semiconductor packages 1101, 1102 and/or 1103 may each comprise relatively lower voltage switching devices (e.g., power FETs). As shown in FIG. 11, power semiconductor packages 1101, 1102 and/or 1103 may individually comprise similar versions of a three switching device power semiconductor package. As mentioned above, power semiconductor packages having at least some characteristics similar to those discussed above in connection with power semiconductor package 200 may include more than two switching devices (e.g., power FETs), in some implementations. A particular example implementation of a three power FET power semiconductor package is discussed below in connection with FIG. 16. As also mentioned, in some implementations, a power semiconductor package may include a single switching device. In example series-parallel power converter arrangement 1100, power semiconductor package 1110 may comprise a single relatively higher voltage switching device. Example series-parallel power converter arrangement 1100 represents another example implementation of a substantially modular power converter arrangement utilizing different implementations of example power semiconductor package types described herein as modular building blocks.

Figure 12:
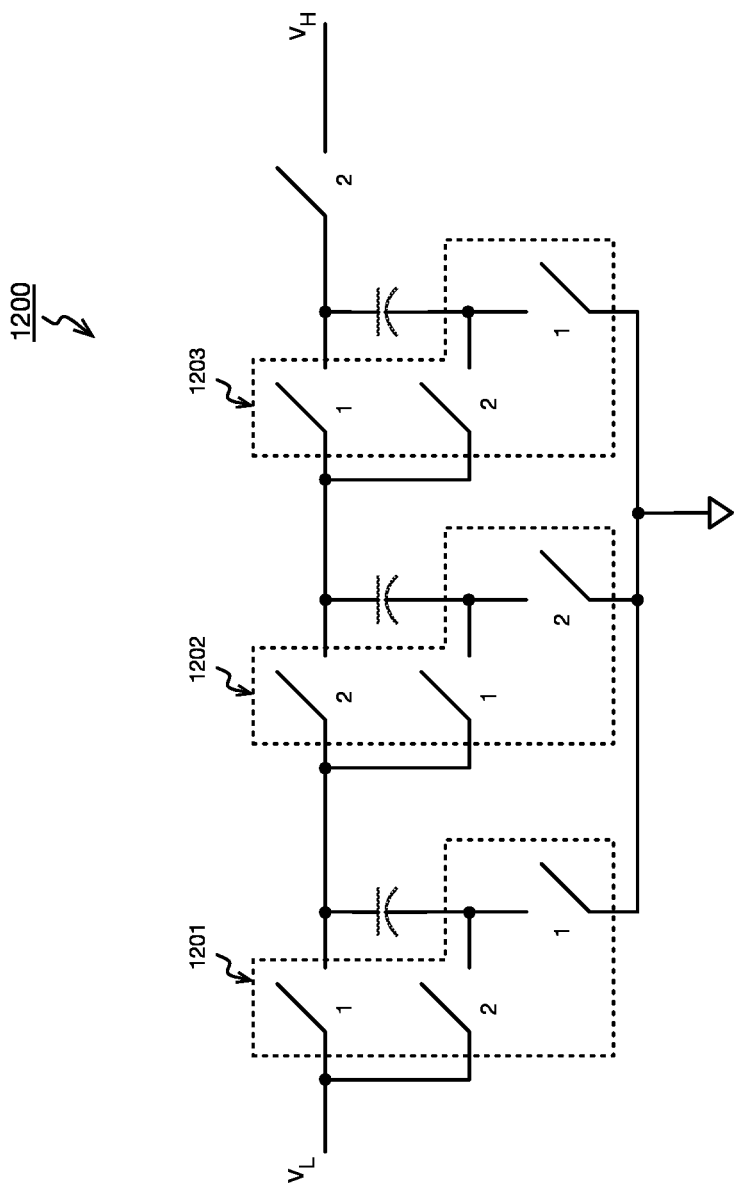
FIG. 12 is a schematic block diagram illustrating an example power converter arrangement in accordance with one or more embodiments.

FIG. 12 is a schematic block diagram illustrating an example power converter arrangement 1200, wherein a voltage conversion ratio is a function of the number of capacitors in the arrangement. For example, as the number of capacitors is increased, the voltage conversion ratio may rise. In a particular implementation, the voltage conversion ratio may rise in accordance with the Fibonacci series as the number of capacitors is increased. In an implementation, Fibonacci power converter arrangement 1200 may include power semiconductor packages 1201, 1202 and/or 1203 that may have some characteristics similar to those of power semiconductor package 200 discussed above and/or power semiconductor package 1600 discussed below. In other implementations, Fibonacci power converter arrangement 1200 may be implemented using discrete switching devices (e.g., power FETs).

As previously discussed, for some implementations, power semiconductor packages may include ball-grid-array packaging technologies. However, for implementations, any of a wide variety of semiconductor device packaging technologies may be utilized. FIGS. 13-16 depict example packaging technologies, as discussed below.

Figure 13:
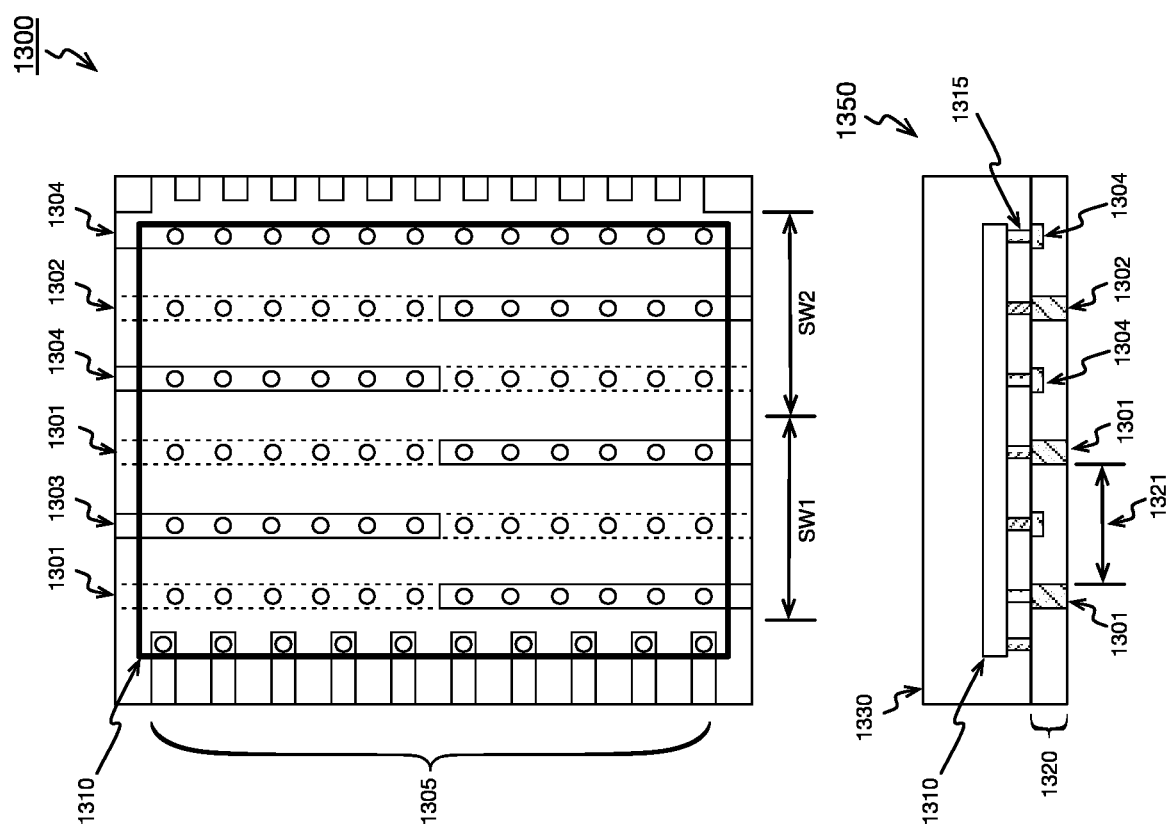
FIG. 13 is an illustration depicting particular views of an example flip-chip on lead-frame semiconductor package in accordance with one or more embodiments.

FIG. 13 is an illustration depicting a particular view of an embodiment 1300 of an example flip-chip on lead-frame semiconductor package that may be utilized to implement power semiconductor packages such as those discussed herein. Example semiconductor package 1300 depicts a top view of a lead frame 1320. An outline of a semiconductor die 1310 is also depicted. A cross-sectional view 1350 of example semiconductor device package 1300 is also provided, including a cross-sectional view of lead frame 1320 and semiconductor die 1310. In an implementation, example package 1300 may include a semiconductor die 1310 situated over a lead frame 1320 encapsulated and/or otherwise positioned within a mold compound 1330, for example. In an implementation, semiconductor die 1310 may be electrically coupled to electrically conductive elements (e.g., 1301, 1302, 1304, etc.) of lead frame 1320 via copper pillars 1315. In other implementations, solder balls may be utilized to electrically couple lead frame 1320 to semiconductor die 1310. Copper pillars may provide advantages, such as reduced resistance, as compared with solder balls, in an implementation.

As depicted, in an implementation, lead frame 1320 may include a number of electrically conductive elements, such as electrically conductive elements 1301, 1302, 1303 and/or 1304. In an implementation, electrically conductive elements of lead frame 1320 may comprise copper bars, although subject matter is not limited in scope in this respect. As depicted in FIG. 13, copper bars, such as copper bar 1301, may include full-thickness sections (e.g., marked by unbroken lines in FIG. 13) and may also include partial-thickness sections (e.g., marked by broken lines). In an implementation, partial-thickness sections of an electrically conductive element, such as copper bar 1301, may provide electrical conductivity between an integrated circuit device (e.g., power FET) and a full-thickness section. Full-thickness sections may provide electrical connectivity to the outside of semiconductor package 1300, for example. In an implementation, utilization of partial-thickness sections of electrically conductive elements of lead frame 1320 may provide electrically conductive element pitch parameters for lead frame 1320 that are smaller (e.g., half) than a specified printed circuit board pitch 1321.

In an implementation, electrically conductive elements 1301 may be utilized to provide electrical connectivity to a first switching device (e.g., power FET) and/or electrically conductive elements 1302 may be utilized to provide electrical connectivity to a second switching device. In an implementation, given an example of semiconductor package 1300 comprising power semiconductor module 200d of example power converter 400 depicted in FIG. 4, electrically conductive elements 1301 may connect to node 412 of power converter 400 and electrically conductive elements 1302 may connect to node 413 of power converter 400, for example. Additionally, in an implementation, electrically conductive elements 1304 may provide electrical connectivity to a PGND terminal of a second power switching device and/or electrically conductive elements 1304 may provide electrical connectivity to a $V_{in}$ terminal of a first power switching device, for example. Of course, subject matter is not limited in scope in these respects.

Also, in an implementation, example semiconductor package 1300 may comprise at least some characteristics of a Quad Flat No-Leads (QFN) package. For example, input/output contacts 1305 located along a particular edge of lead frame 1320 and/or positioned at the bottom of example semiconductor package 1300 may be electrically connected to semiconductor die 1310 via one or more copper pillars (or solder bumps), in an implementation. Of course, subject matter is not limited in scope in these respects.

Figure 14:
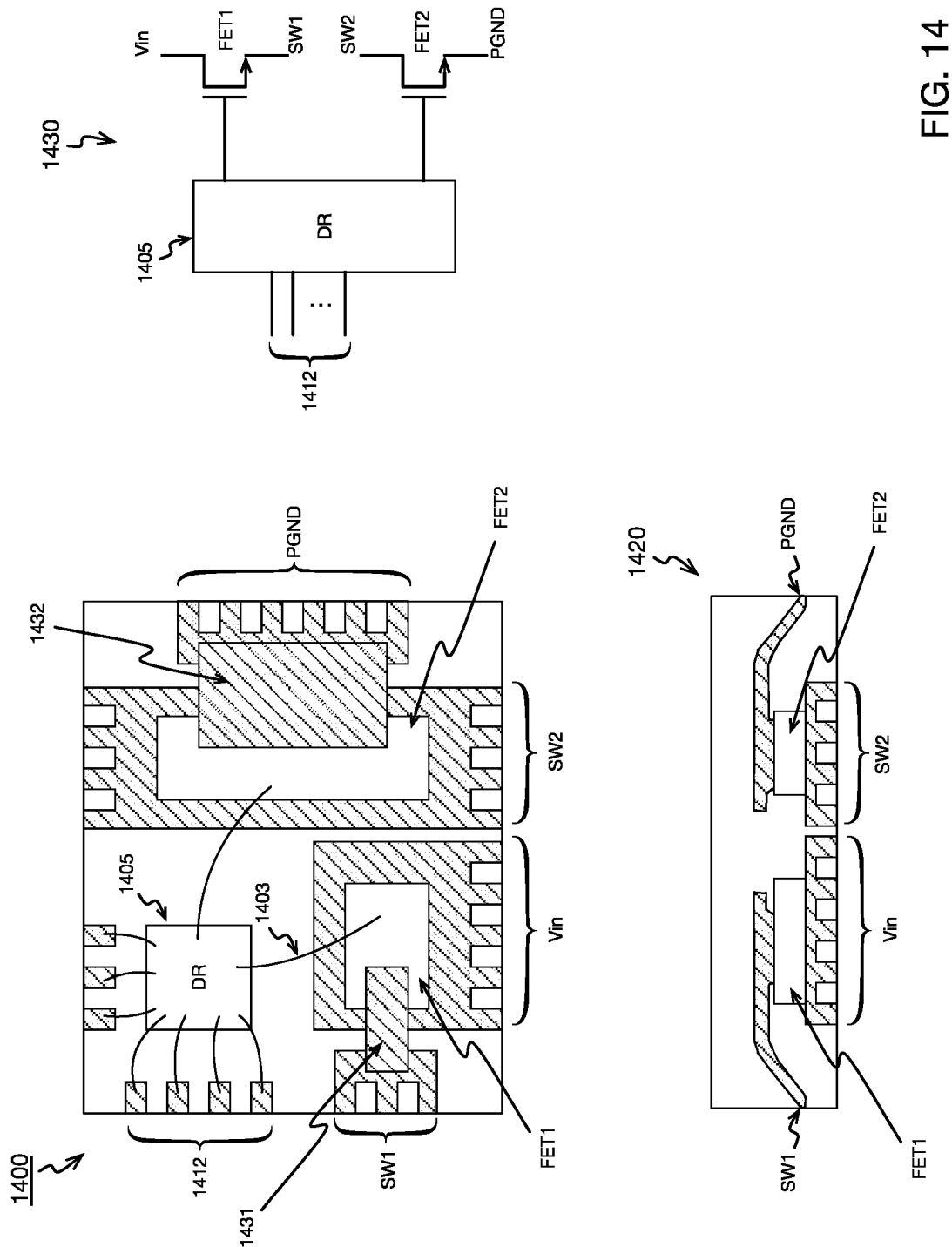
FIG. 14 is an illustration depicting an example power semiconductor package utilizing QFN packaging technology in accordance with one or more embodiments.

FIG. 14 is an illustration depicting an example power semiconductor package 1400 having one or more characteristics with a QFN packaging technology. In an implementation, power semiconductor package 1400 may include at least some characteristics of power semiconductor package 200, discussed above. For example, power semiconductor package 1400 may include an integrated circuit 1405 comprising driver circuitry, etc. (e.g., driver circuitry 211 and/or 212, level shifter circuitry 221 and/or 222, etc.) coupled to a first power FET (FET1) and a second power FET (FET2).

In an implementation, driver circuitry 1405 may be electrically coupled to gate regions of FET1 and/or FET2 via one or more bond wires 1403. Bond wires may also couple driver circuitry 1405 to lead frame contacts 1412 which may be utilized for control signals, timing signals, etc., for example. A simplified schematic view 1430 of power semiconductor package 1400 is also provided, depicting driver circuitry 1405 coupled to FET1 and FET2 and also depicting terminals Vin and SW1 of FET1 and terminals SW2 and PGND of FET2. A cross-sectional view 1420 is also provided.

In an implementation, FET1 and/or FET2 may comprise "vertical" metal oxide semiconductor field effect transistors (MOSFET). Further, FET1 and/or FET2 may be arranged within semiconductor package 1400 in a "horizontal" fashion (e.g., placed side-by-side and/or not stacked one on top of another). For example, in an implementation, a source terminal of FET1 (e.g., located at a top region of FET1) may be coupled with SW1 lead frame contacts via a copper clip 1431. A drain terminal of FET1 (e.g., located at a bottom region of FET1) may be electrically coupled to Vin contacts of the lead frame, as depicted. Although FET1 and FET2 are described and/or depicted having source and gate contacts located at a top region of the respective switching devices, other implementations may locate drain regions of FET1 and/or FET2 on top with source regions located on bottom.

Further, in an implementation, a source terminal of FET2 (e.g., located at a top region of FET2) may be coupled with PGND lead frame contacts via a copper clip 1432. A drain terminal of FET2 (e.g., located at a bottom region of FET2)

may be electrically coupled to SW2 contacts of the lead frame, as shown in FIG. 14. It may be noted that, in an implementation, FET2 may be larger than FET1. In various implementations, the relative sizes of FET1, FET2 and/or other power switching devices may be designed to accommodate particular specifications and/or applications. Also, although example power semiconductor package 1400 depicts three separate semiconductor dies (e.g., one for driver circuitry 1405, one for FET1 and another for FET2), other implementations may fabricate the various circuits and/or components on fewer than three semiconductor dies or on more than three semiconductor dies.

Figure 15:
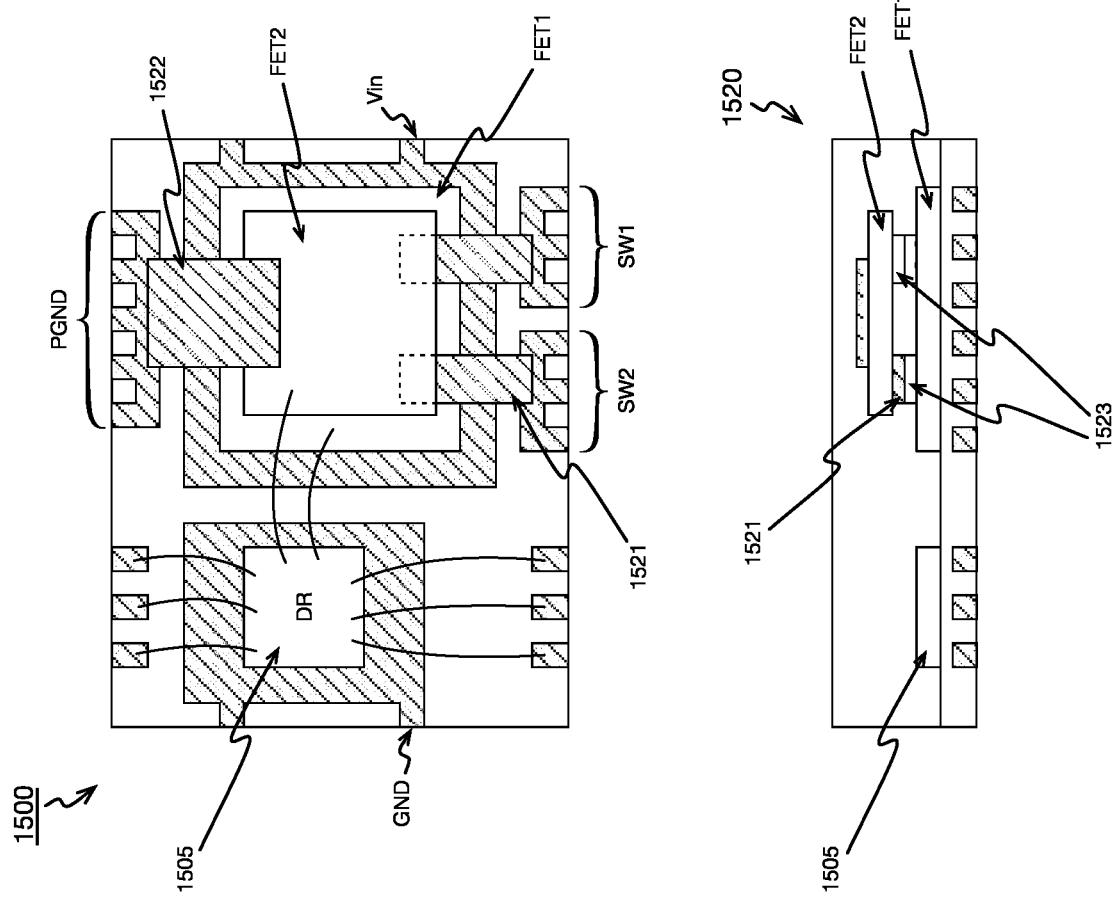
FIG. 15 is an illustration depicting another example power semiconductor package utilizing QFN packaging technology in accordance with one or more embodiments.

FIG. 15 is an illustration depicting another example power semiconductor package 1500 having one or more characteristics with a QFN packaging technology. A cross-sectional view 1520 is also provided. In an implementation, power semiconductor package 1500 may include at least some characteristics of power semiconductor package 200, discussed above. For example, power semiconductor package 1500 may include an integrated circuit 1505 comprising driver circuitry, etc. (e.g., driver circuitry 211 and/or 212, level shifter circuitry 221 and/or 222, etc.) coupled to a first power FET (FET1) and a second power FET (FET2).

As discussed above, power semiconductor package 1400 depicted in FIG. 14 includes vertically-constructed FET1 and FET2 arranged in a horizontal (e.g., non-stacked) configuration. In contrast, example power semiconductor package 1500 comprises FET1 and FET2 stacked in a vertical fashion (e.g., vertical QFN stacking). For example, as depicted in FIG. 15, FET2 may be positioned above FET1. In an implementation electrically conductive elements (e.g., copper bars and/or clips) 1521 may provide electrical connectivity between FET1 and SW1 lead frame contacts and/or may provide electrical connectivity between FET2 and SW2 lead frame contacts. Another copper clip 1522 may connect FET 2 to PGND lead frame contacts, for example. Insulators 1523 may provide electrical isolation between FET1 and FET2, for example.

Again, although example power semiconductor package 1500 depicts three separate semiconductor dies (e.g., one for driver circuitry 1505, one for FET1 and another for FET2), other implementations may fabricate the various circuits and/or components on fewer than three semiconductor dies or on more than three semiconductor dies.

Figure 16:
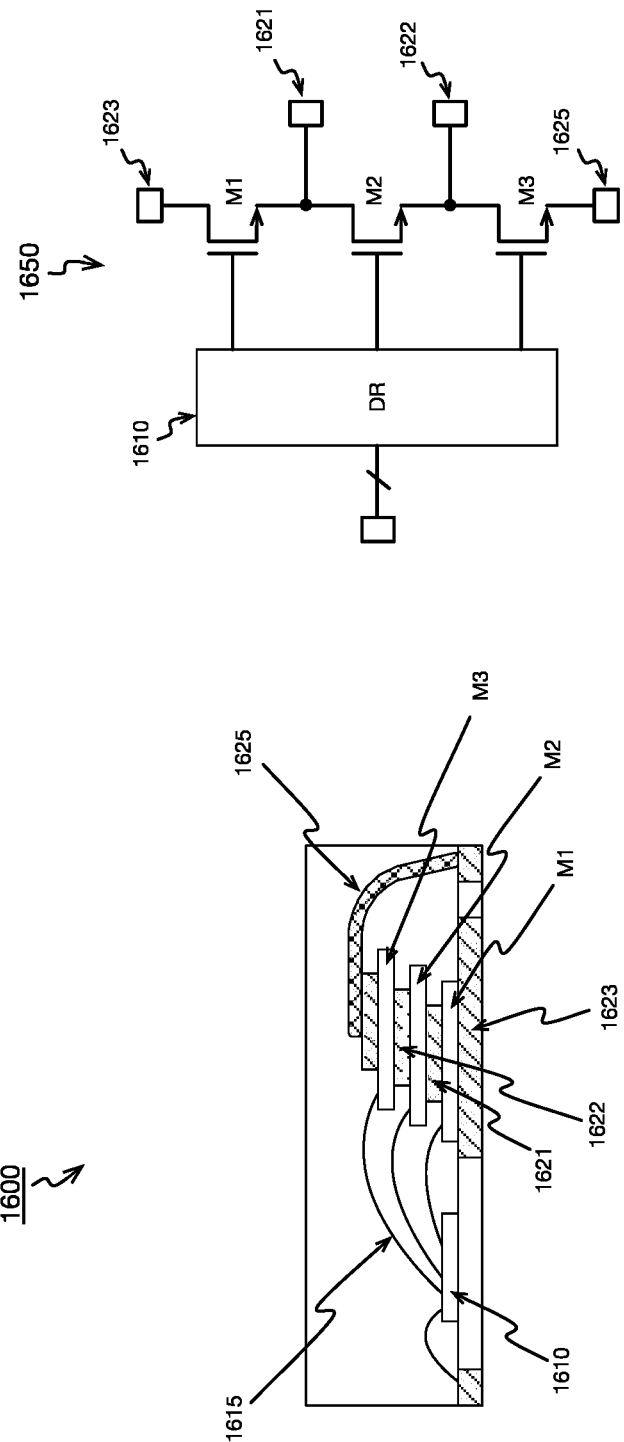
FIG. 16 is an illustration depicting an example power semiconductor package including three power switching devices in accordance with one or more embodiments.

FIG. 16 is an illustration depicting an example power semiconductor package 1600 including three power switching devices, such as power MOSFETS M1, M2 and M3. In an implementation, power semiconductor package 1600 may comprise a QFN package wherein the several switching devices M1, M2 and M3 may be stacked vertically. Also, in an implementation, M1 may be electrically connected to M2 via an electrically conductive element 1621 and M2 may be electrically connected to M1 via an electrically conductive element 1622. For example, a source region of M1 may be electrically connected to a drain region of M2. Further, for example, a source region of M2 may be electrically connected to a drain region of M3. This is in contrast to power semiconductor package 1500, discussed above, wherein stacked devices FET1 and FET2 are isolated via insulators 1523, for example.

In some circumstances, stacking of power switching devices, such as M1, M2 and/or M3, for example, may result in increased temperatures within a package, such as example power semiconductor package 1600. In an implementation, a heat sink may be advantageously utilized to spread and/or dissipate heat. Further, although power switching devices M1, M2 and M3 for example power semiconductor package 1600 are depicted and/or described as being configured in a stacked fashion, other implementations are possible. For example, in an implementations, M1, M2 and/or M3 may be positioned side-by-side in a manner similar in at least some respects to power switching devices FET1 and FET2 depicted in example power semiconductor package 1400 (see FIG. 14).

In an implementation, an semiconductor die 1610 (e.g., driver circuitry, level shifters, etc.) may be electrically connected to switching devices M1, M2 and/or M3 via bond wires 1615. It may be noted that M1, M2 and/or M3 may be stacked in an offset fashion to provide an area for bond wires 1615 to land, in an implementation. Further, in an implementation, a copper clip 1625 may electrically connect M3 to a lead frame of power semiconductor device 1600. Additional electrically conductive elements (e.g., copper clips, copper bars, etc.) may be provided to electrically connect electrically conductive elements 1621 and/or 1622 to appropriate lead frame contacts. One or more lead frame elements 1623 may provide electrical connectivity to a drain region of M1, in an implementation.

For example, as seen in schematic view 1650, separate terminals may be provide for the drain region of M1, the source region of M3, the connection between M1 and M2, and for the connection between M2 and M3. One or more terminals may also be provided for inputs of semiconductor die 1610, for example. As will be discussed more fully below, separate terminals of the M1, M2, M3 stack of switching devices may allow for a variety of advantageous implementations of power converter arrangements.

Figure 17:
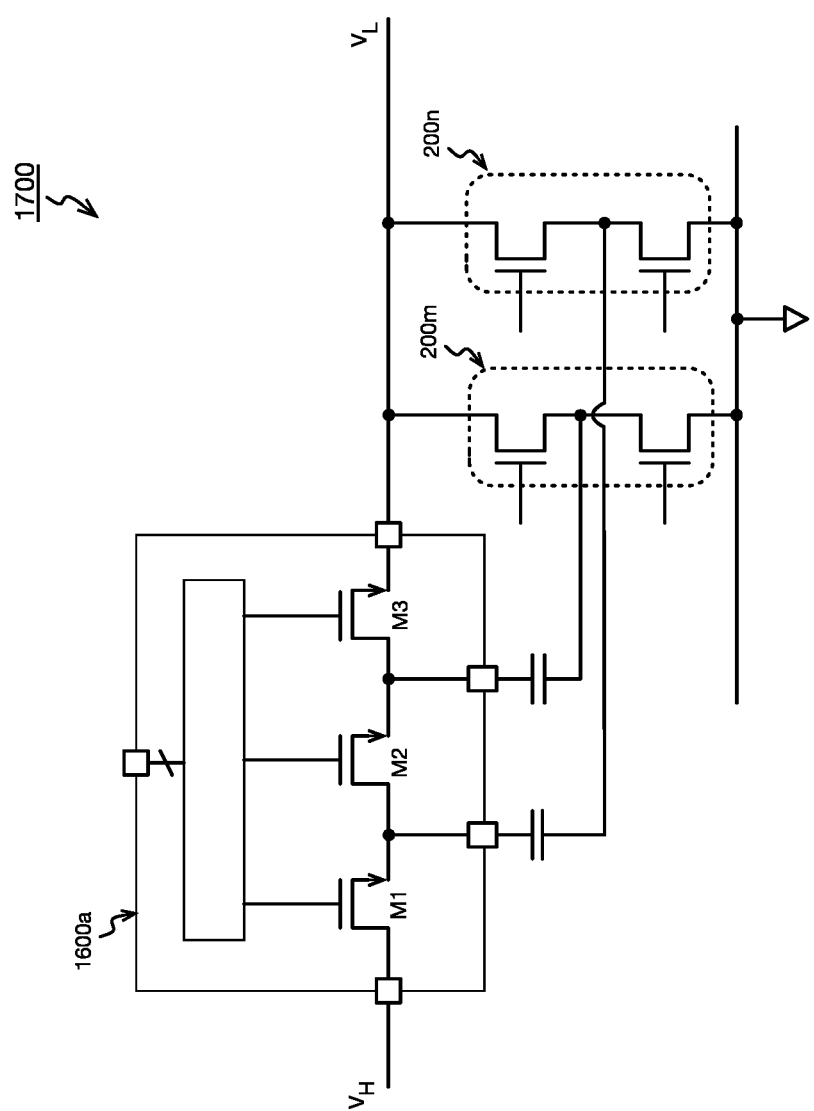
FIG. 17 is a schematic block diagram illustrating an example 3:1 charge pump arrangement in accordance with one or more embodiments.

FIG. 17 is a schematic block diagram illustrating an example power converter arrangement 1700. In an implementation, power converter arrangement 1700 may comprise a 3:1 charge pump utilizing a power semiconductor package 1600a that may comprise at least some characteristics similar to those discussed above in connection with three switching device power semiconductor package 1600. 3:1 charge pump arrangement 1700 may also comprise power semiconductor packages 200m and 200n that may comprise at least some characteristics similar to those discussed above in connection with power semiconductor package 200. Thus, utilizing two different types of power semiconductor packages, a 3:1 charge pump 1700 may be implemented in a modular fashion.

Figure 18:
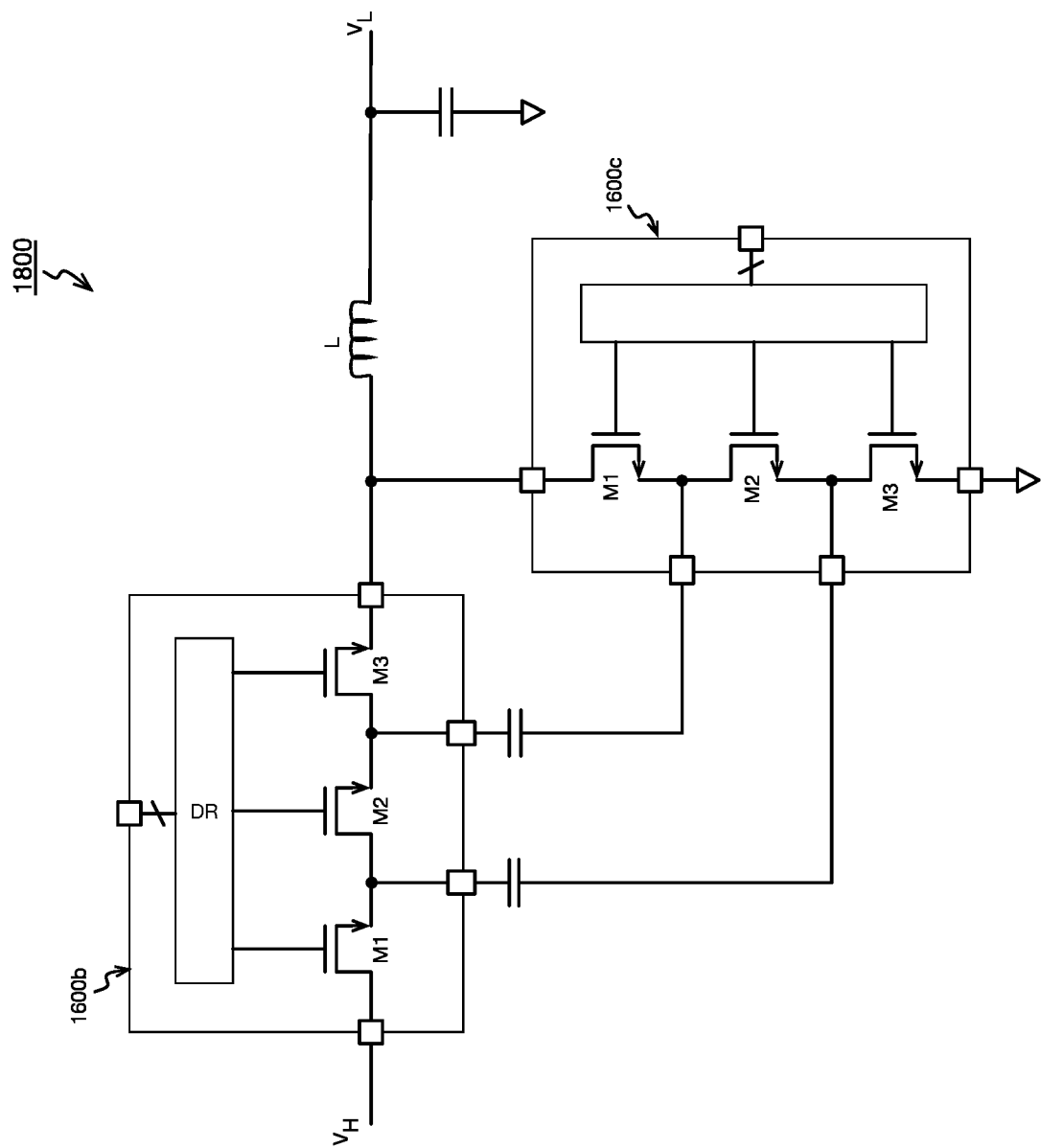
FIG. 18 is a schematic block diagram illustrating an example four level buck converter arrangement in accordance with one or more embodiments.

FIG. 18 is a schematic block diagram illustrating an example power converter arrangement 1800. In an implementation, power converter arrangement 1800 may comprise a four level buck converter arrangement. In an implementation, four level buck converter 1800 may include a pair of three switching device power semiconductor packages 1600b and 1600c. In an implementation, power semiconductor packages 1600b and/or 1600c may comprise at least some characteristics similar to those discussed above in connection with three switching device power semiconductor package 1600. Thus, utilizing a pair of power semiconductor packages, four level buck converter 1800 may be implemented in a modular fashion.

Figure 19:
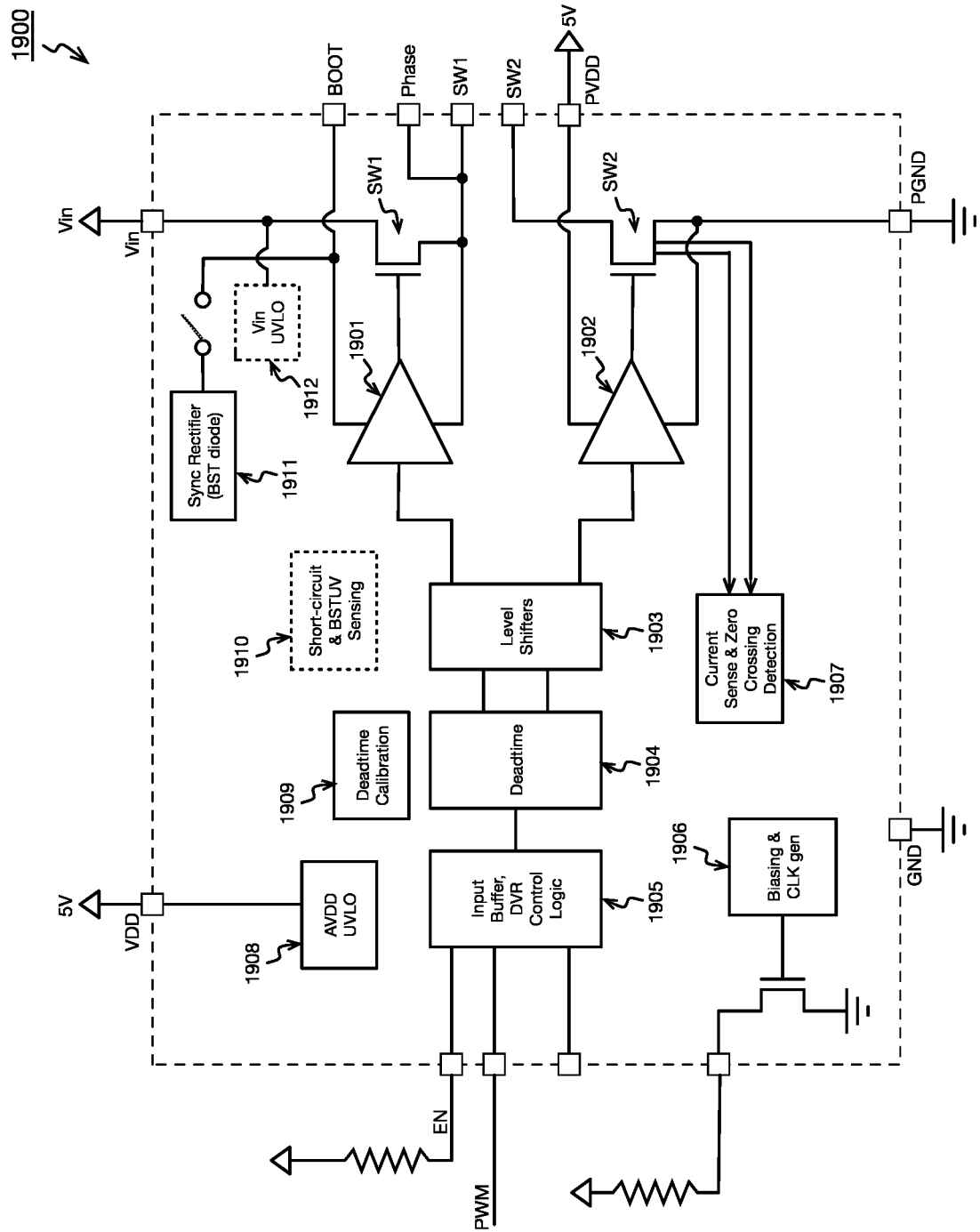
FIG. 19 depicts a schematic block diagram illustrating an example power semiconductor package in accordance with one or more embodiments.

FIG. 19 depicts a schematic block diagram illustrating an embodiment 1900 of an example power semiconductor package. In an implementation, power semiconductor package 1900 may comprise at least some characteristics similar to those discussed above in connection with power semiconductor package 200 of FIG. 2 and/or in connection with other example power semiconductor packages discussed herein. FIG. 19 depicts further details with respect to possible circuit types that may be included in various implementations of power semiconductor packages. For example, similar to example power semiconductor package 200, power semiconductor package 1900 may include a power path comprising a high-side switch (e.g., SW1) and a low-side switch (e.g., SW2) which may be driven by respective driver circuits (e.g., drivers 1901 and 1902). Also, similar to example power semiconductor package 200, example power semiconductor package 1900 may include level-shifting circuitry (e.g., level shifters 1903). Example power semiconductor package 1900 may also include deadtime control circuitry 1904 and/or deadtime calibration circuitry 1909, in an implementation. Further, in an implementation, example power semiconductor package 1900 may include an input buffer and/or driver control logic 1905. An enable signal may be provided to input buffer and/or driver control logic 1905, for example, as well as a pulse-width-modulation (PWM) timing signal, for example.

Additionally, in an embodiment, power semiconductor package 1900 may include biasing and clock generation circuitry 1906 and/or may further include current sense and/or zero crossing detection circuitry 1907, for example. Undervoltage lock-out (UVLO) circuits, such as $V_{in}$ UVLO 1912 and/or AVDD UVLO 1908 may be included, in an implementation. Also, in an implementation, example power semiconductor package 1900 may comprise short-circuit and/or bootstrap under voltage (BSTUV) sensing circuitry, for example. Additionally, for example, a sync rectifier circuit 1911 may be provided, in an implementation.

As mentioned, example power semiconductor package 1900 may include separate terminals for high-side power switching device SW1 and low-side power switching device SW2. As also previously mentioned, providing separate terminals for high-side and low-side switching devices may, at least in part, allow for the use of power semiconductor packages, such as power semiconductor package 1900, for example, as building blocks for more sophisticated and/or larger circuit arrangements. It should further be understood that the particular arrangement and/or configuration of example power semiconductor package 1900 represents merely a single possible implementation, and a wide range of other implementations are possible.

Figure 20:
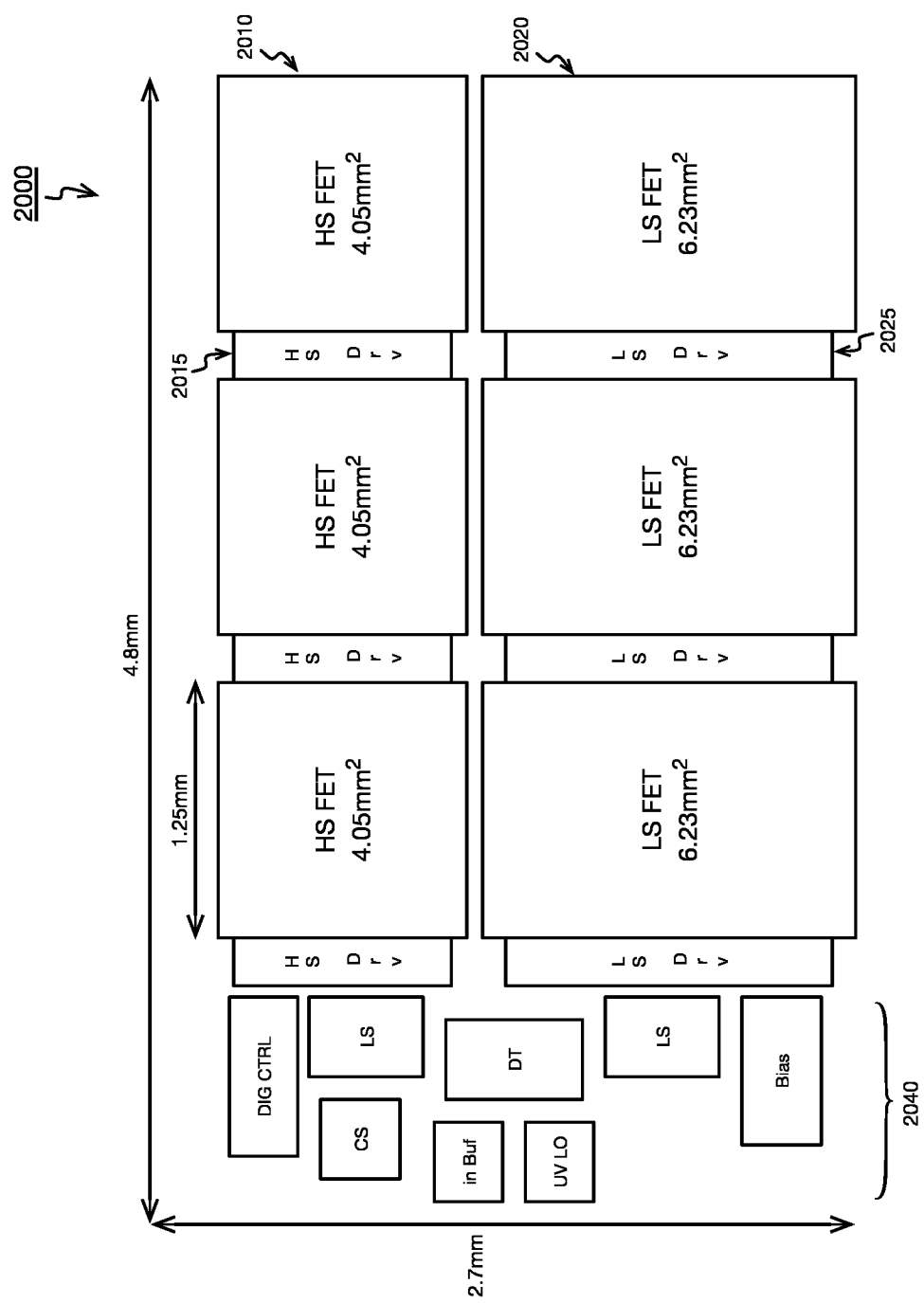
FIG. 20 depicts a block diagram illustrating an example power semiconductor package including segmented power switching devices, in accordance with one or more embodiments.

FIG. 20 depicts a block diagram illustrating an embodiment 2000 of an example power semiconductor package including segmented power switching devices. Example power semiconductor package 2000 may comprise at least some characteristics of example power semiconductor package 200 in an implementation. For the example depicted in FIG. 20, power switching devices of example power semiconductor package 2000 may be laid out on an integrated circuit in a segmented fashion. For example, a high-side switch (e.g., HS FET) 2010 may be partitioned into several segments, with individual segments accompanied and/or driven by respective distributed drive circuits (e.g., HS Drv) 2015. In an implementation, individual segments of HS FET 2010 may comprise an area of 4.05 mm$^2$, although subject matter is not limited in scope in this respect. Also, for example, a low-side switch (e.g., LS FET) 2020 may be partitioned into several segments, with individual segments accompanied and/or driven by respective distributed drive circuits (e.g., LS Drv) 2025. In an implementation, individual segments of LS FET 2020 may comprise an area of 6.23 mm$^2$, although, again, subject matter is not limited in scope in these respects.

In an implementation, example power semiconductor package 2000 may include at least some of the same types of circuitry (e.g., circuitry 2040) discussed above in connection with example power semiconductor packages 200 and/or 1900, for example. In an implementation, circuitry 2040 may include, for example, level shifters, a deadtime controller, an input buffer, undervoltage lockout circuitry, current sensing circuitry, bias circuitry, one or more controllers, etc., to merely list a few non-limiting examples. In an implementation, segmentation of power switching devices, such as HS FET 2010 and/or LS FET 2020, may result in reduced parasitic capacitance and/or reduced resistance, for example.

As mentioned, although particular examples of power converter arrangements are provided, subject matter is not limited in scope to these particular examples. Similarly, subject matter is not limited in scope to the particular power semiconductor package implementations discussed. As also mentioned, utilization of power semiconductor packages such as, for example, 200, 700, 1600, 1900 and/or 2000, to implement various power converter arrangements such as, for example, power converters 300, 400, 800, 900, 1100, 1200, 1700 and/or 1800, a number of advantages and/or benefits may be realized. For example, the substantially modular approaches described in connection with particular implementations may provide size, cost, and/or performance advantages. Such implementations may be relatively easily scaled in size and/or capabilities for a variety of applications having different voltage and/or current needs. Further, for some implementations, performance (e.g., efficiency) may be enhanced, costs may be reduced, size may be reduced, ease-of-manufacture may be improved, etc. Implementations may also provide advantages of customization without the added time and cost of producing custom/bespoke integrated circuits. For example, power semiconductor package implementations may be combined to build up sophisticated circuits without the time and cost of producing fully integrated, custom integrated circuits. System design may be made more simple in the areas of timing control, synchronization, etc. Further, performance advantage may also be realized (e.g., as compared with discrete approaches). For example, using a more modular approach made possible using power semiconductor packages such as those described herein, reductions in parasitic characteristics (e.g., capacitance) between components may allow for higher switching frequencies, for example.

Figure 21:
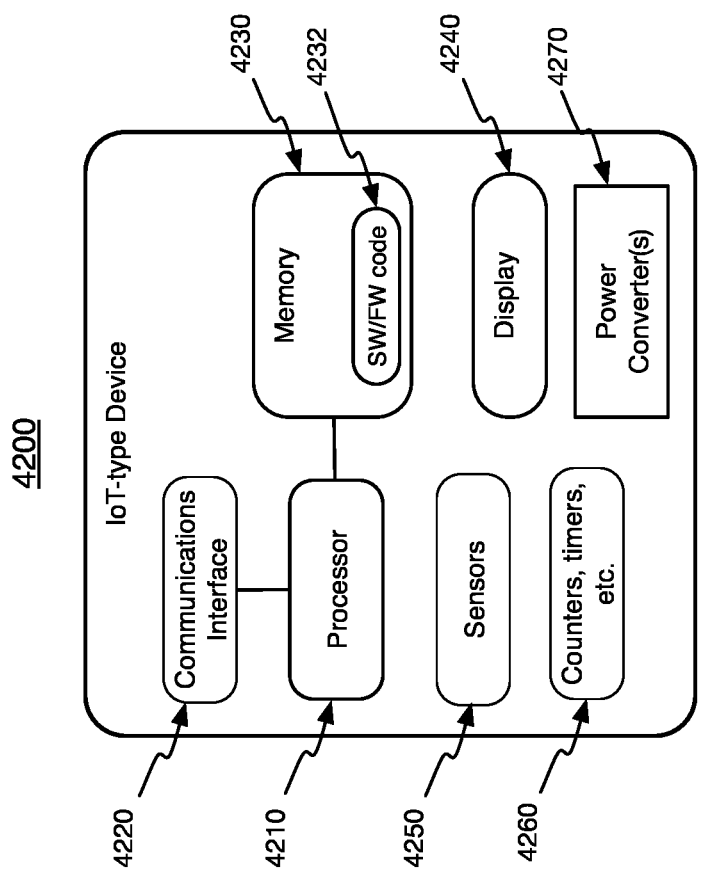
FIG. 21 is a schematic block diagram depicting an embodiment of an example Internet of Things (IoT) type device.
Figure 22:
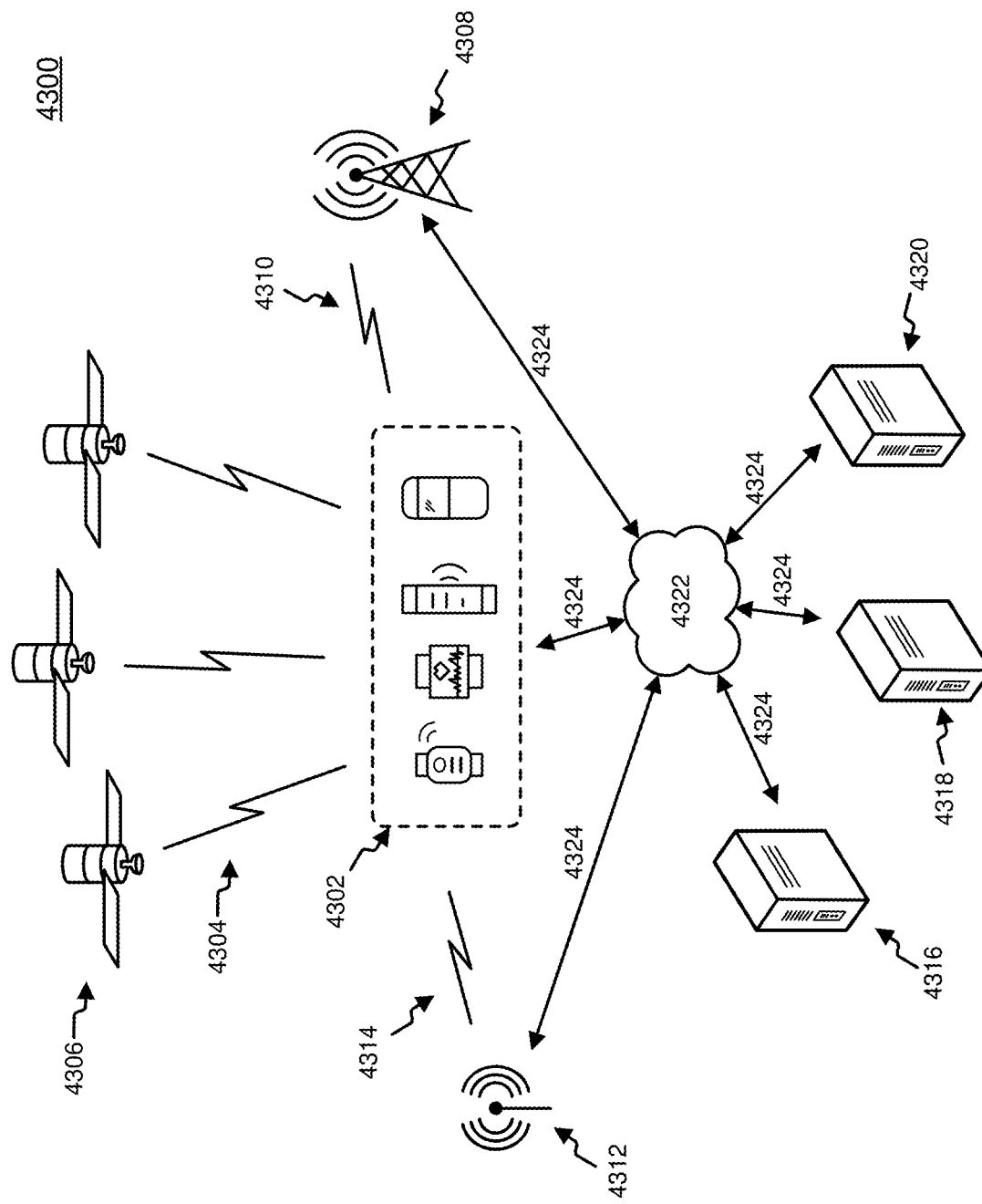
FIG. 22 is a schematic block diagram depicting an embodiment of an example system including one or more server computing devices and/or one or more IoT-type devices.
Figure 23:
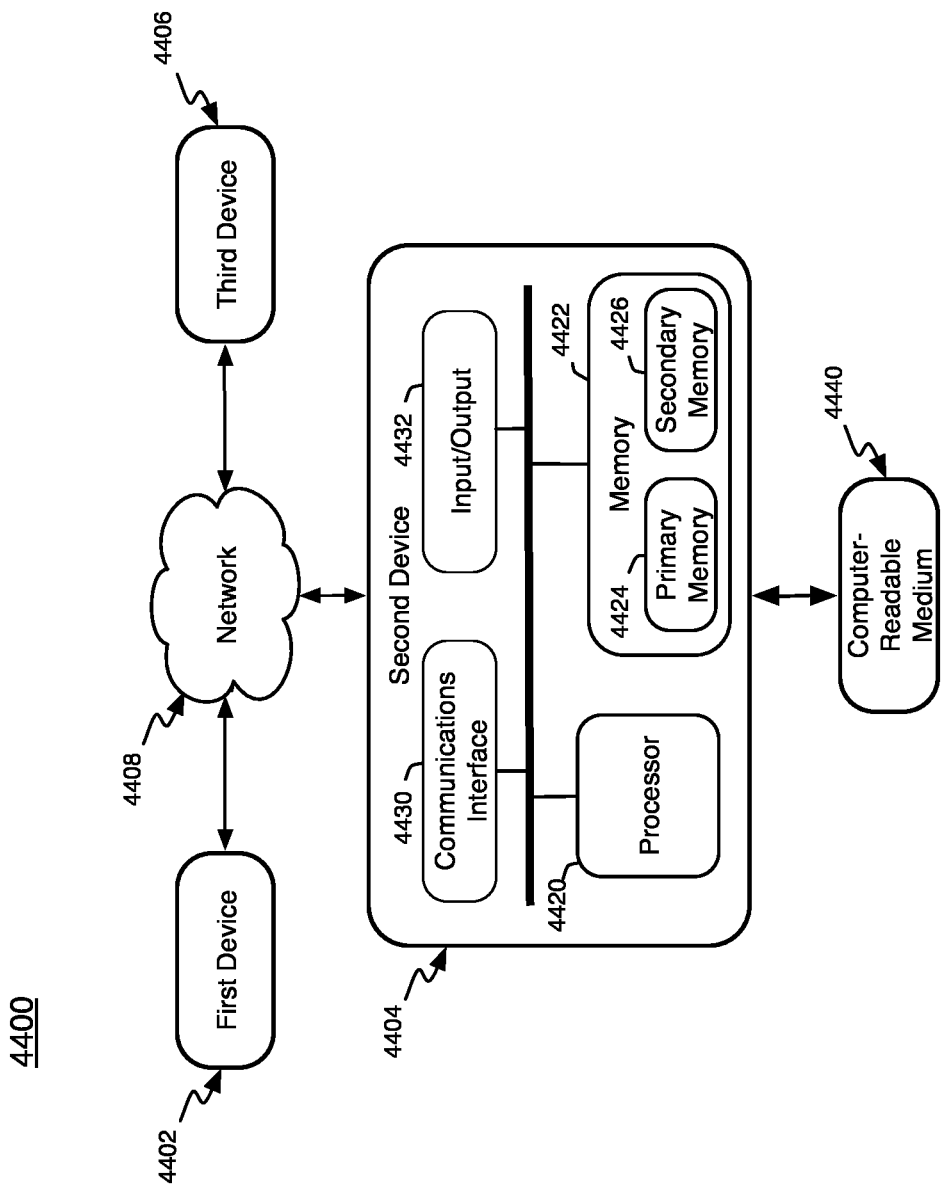
FIG. 23 is a schematic block diagram illustrating an embodiment of an example computing device.

As mentioned, power semiconductor packages may be utilized to implement power converters that may be utilized in a wide range of electronic device types. FIG. 21 through FIG. 23 depict example types of electronic devices that may incorporate one or more of the example implementations and/or embodiments related to power semiconductor packages and/or power converter arrangements described herein. Of course, claimed subject matter is not limited in scope to the particular examples provided herein.

FIG. 21 is an illustration of an embodiment 4200 of an example particular IoT device. Of course, claimed subject matter is not limited in scope to the particular configurations and/or arrangements of components depicted and/or described for example devices mentioned herein. In an embodiment, an IoT-type device, such as 4200, may comprise one or more processors, such as processor 4210, and/or may comprise one or more communications interfaces, such as communications interface 4220. In an embodiment, one or more communications interfaces, such as communications interface 4220, may enable wireless communications between an electronic device, such as an IoT-type device 4200, and one or more other computing devices. In an embodiment, wireless communications may occur substantially in accordance any of a wide range of communication protocols, such as those mentioned herein, for example.

In a particular implementation, an IoT-type device, such as IoT-type device 4200, may include a memory, such as memory 4230. In a particular implementation, memory 4230 may comprise a non-volatile memory, for example. Further, in a particular implementation, a memory, such as memory 4230, may have stored therein executable instructions, such as for one or more operating systems, communications protocols, and/or applications, for example. A memory, such as 4230, may further store particular instructions, such as software and/or firmware code 4232, that may be updated via one or more example implementations and/or embodiments described herein. Further, in a particular implementation, an IoT-type device, such as IoT-type device 4200, may comprise a display, such as display 4240, and/or one or more sensors, such as one or more sensors 4250. As utilized herein, "sensors" and/or the like refer to a device and/or component that may respond to physical stimulus, such as, for example, heat, light, sound pressure, magnetism, particular motions, etc., and/or that may generate one or more signals and/or states in response to physical stimulus. Example sensors may include, but are not limited to, one or more accelerometers, gyroscopes, thermometers, magnetometers, barometers, light sensors, proximity sensors, hearrate monitors, perspiration sensors, hydration sensors, breath sensors, cameras, microphones, etc., and/or any combination thereof.

In particular implementations, IoT-type device 4200 may include one or more timers and/or counters and/or like circuits, such as circuitry 4260, for example. In an embodiment, one or more timers and/or counters and/or the like may track one or more aspects of device performance and/or operation.

Additionally, IoT-type device 4200 may include one or more power converters 4270. In particular implementations, power converter 4270 may comprise one or more example implementations described herein. In a particular implementation, power converter circuits 4270 may provide power to one or more circuits, sensors, processors, memory devices, display devices, communications interfaces, etc., of IoT-type device 4200.

Although FIG. 21 depicts a particular example implementation of an IoT-type device, such as IoT-type device 4200, other embodiments may include other types of electronic and/or computing devices incorporating microprocessors and/or servers at data centers, for example. Example types of electronic and/or computing devices may include, for example, any of a wide range of digital electronic devices, including, but not limited to, desktop and/or notebook computers, high-definition televisions, digital video players and/or recorders, game consoles, satellite television receivers, cellular telephones, tablet devices, wearable devices, personal digital assistants, mobile audio and/or video playback and/or recording devices, or any combination of the foregoing.

In particular implementations, power converters 4270, for example, may include at least some aspects of example power converter circuit implementations and/or power semiconductor package implementations described herein. The following describes a number of possible implementations for power converter(s) 4270, although subject matter is not limited in scope in these respects.

In some embodiments, power converters 4270 may include one or more power semiconductor packages. For example, in an implementation, a power semiconductor package may comprise a power transfer path including a high-side switch and a low-side switch, a first terminal coupled to a first node of the high-side switch, a second terminal coupled to a second node of the low-side switch, a high-side switch terminal coupled to a second node of the high-side switch, and a low-side switch terminal coupled to a first node of the low-side switch, wherein the high-side switch terminal and the low-side switch terminal comprise separate terminals. In an implementation, a power semiconductor package may further comprise a high-side driver coupled to a control terminal of the high-side switch and may comprise a low-side driver coupled to a control terminal of the low-side switch. Further, in an implementation, a power semiconductor package may further comprise a first boot supply terminal coupled to the high-side driver and a second boot supply terminal coupled to the low-side driver, wherein the first boot supply terminal is separate from the second boot supply terminal.

In an implementation, a power semiconductor package may further include a controller coupled to the high-side driver and further coupled to the low-side driver to generate at least a high-side driver control signal and a low-side driver control signal to affect operation of the high-side and low-side switches. In an implementation, a power semiconductor package may also include a first level shifter coupled between the controller and the high-side driver and a second level shifter coupled between the controller and the low-side driver. Further, in an implementation, a power semiconductor package may further comprise a timing signal input terminal coupled to the controller. In an implementation, a power semiconductor package may further comprise a control signal output terminal, wherein the controller to generate one or more control signals to be provided to one or more external power semiconductor packages.

In an implementation, a power semiconductor package may further include a first semiconductor die, wherein the high-side driver, the low-side driver, the first level shifter, the second level shifter or the controller, or a combination thereof, are formed on the first semiconductor die. In an implementation, the high-side switch or the low-side switch, or a combination thereof, may comprise at least a second semiconductor device that is separate from the first semiconductor die. Also, in an implementation, the first semiconductor die may be substantially formed of different material and/or may be formed via a substantially different process than the at least the second semiconductor.

Additionally, in an implementation, one or more power semiconductor packages may be included in a switched-capacitor charge pump circuit. Further, in an implementation, a high-side switch and a low-side switch may be arranged in a stacked fashion within an encapsulating material. In other implementations, a high-side switch and a low-side switch may be arranged in a horizontal fashion within an encapsulating material.

Also, in an implementation, a power semiconductor package may further comprise a lead-frame including: a first plurality of electrically conductive elements electrically coupled to the first switch terminal via a first plurality of electrically conductive pillars and/or solder balls; and a second plurality of electrically conductive elements electrically coupled to the second switch terminal via a second plurality of electrically conductive pillars and/or solder balls. In an implementation, the first plurality of electrically conductive elements and/or the second plurality of electrically conductive elements may comprise copper bars.

Further, in an implementation, a high-side switch may be fabricated on a first semiconductor die and a low-side switch may be fabricated on a second semiconductor die. Also, in an implementation, a power semiconductor device may further comprise driver circuitry fabricated on a third semiconductor die. In an implementation, the first semiconductor die and the second semiconductor die may be arranged in stacked fashion, wherein the driver circuitry may be coupled to the high-side switch and the low-side switch via bond wires. In another implementation, the first semiconductor die and the second semiconductor die may be arranged in a horizontal fashion, and the driver circuitry may be coupled to the high-side switch and the low-side switch via bond wires.

In other embodiments, power converters, such as power converters 4270, for example, may comprise a multi-level power converter including a plurality of power semiconductor packages, wherein the plurality of power semiconductor packages may individually comprise a power transfer path comprising at least a high-side switch and a low-side switch, a first terminal coupled to a first node of the high-side switch, a second terminal coupled to a second node of the low-side switch, a high-side switch terminal coupled to a second node of the high-side switch, and a low-side switch terminal coupled to a first node of the low-side switch, wherein the high-side switch terminal and the low-side switch terminal comprise separate terminals.

In an implementation, the plurality of power semiconductor packages may individually further comprise a high-side driver coupled to a control terminal of the high-side switch and a low-side driver coupled to a control terminal of the low-side switch. Also, in an implementation, the plurality of power semiconductor packages may individually further comprise a first boot supply terminal coupled to the high-side driver and a second boot supply terminal coupled to the low-side driver, wherein the first boot supply terminal is separate from the second boot supply terminal. In an implementation, the multi-level power converter may further comprise at least one first boot capacitor coupled between the high-side switch terminal and the first boot supply terminal for a respective at least a first one of the plurality of power semiconductor packages and at least one second boot capacitor coupled between the second terminal coupled to the second node of the low-side switch and a second boot supply terminal for the respective at least the first one of the plurality of power semiconductor packages.

In an implementation, at least one of the plurality of power semiconductor packages may include a controller to affect operation of the respective high-side switches and low-side switches of the plurality of power semiconductor packages. Also, in an implementation, a controller of a first of the plurality of power semiconductor packages may provide at least one control signal to at least one other of the plurality of power semiconductor packages.

In an additional implementation, a multi-level power converter may comprise a multi-level buck arrangement. For example, in an implementation, the first terminal coupled to the first node of the high-side switch for a first of the plurality of power semiconductor packages may comprise a higher voltage node for the multi-level buck arrangement. Further, in an implementation, for one or more of the plurality of power semiconductor packages, the high-side switch terminal and the low-side switch terminal may be electrically connected to a lower voltage node for the multi-level buck arrangement.

In particular implementations, power converters 4270, for example, may include at least some aspects of example power semiconductor package implementations described herein. In some embodiments, power converters, such as power converters 4270, may comprise a series-capacitor converter including a plurality of power semiconductor packages, wherein the plurality of power semiconductor packages may individually comprise a power transfer path comprising at least a high-side switch and a low-side switch, a first terminal coupled to a first node of the high-side switch, a second terminal coupled to a second node of the low-side switch, a high-side switch terminal coupled to a second node of the high-side switch, and a low-side switch terminal coupled to a first node of the low-side switch, wherein the high-side switch terminal and the low-side switch terminal comprise separate terminals.

In an implementation, the plurality of power semiconductor packages may individually further comprise a high-side driver coupled to a control terminal of the high-side switch and a low-side driver coupled to a control terminal of the low-side switch. Further, in an implementation, the plurality of power semiconductor packages may individually further comprise a first boot supply terminal coupled to the high-side driver and a second boot supply terminal coupled to the low-side driver, wherein the first boot supply terminal may be separate from the second boot supply terminal. Also, in an implementation, a series-capacitor converter may further comprises at least one first boot capacitor coupled between the high-side switch terminal and the first boot supply terminal for a respective at least a first one of the plurality of power semiconductor packages and at least one second capacitor coupled between the high-side switch terminal and the low-side switch terminal for the respective at least the first one of the plurality of power semiconductor packages.

In an implementation, at least one of the plurality of power semiconductor packages may include a controller to affect operation of the respective high-side switches and low-side switches of the plurality of power semiconductor packages. Also, in an implementation, a controller of a first of the plurality of power semiconductor packages may provide at least one control signal to at least one other of the plurality of power semiconductor packages.

In an implementation, a series-capacitor converter may comprises a multi-phase series-capacitor buck arrangement. For example, in an implementation, a multi-phase series-capacitor buck arrangement may further comprise a plurality of inductors, wherein at least one inductor of the plurality of inductors may be coupled between the respective low-side switch terminals of the plurality of power semiconductor packages and a lower voltage node. Further, in an implementation, the first terminal coupled to the first node of the high-side switch for a first of the plurality of power semiconductor packages may comprise a higher voltage node for the multi-phase series-capacitor buck arrangement. In an implementation, the first terminal coupled to the first node of the high-side switch for a second of the plurality of power semiconductor packages may be electrically coupled to the high-side switch terminal of a first of the plurality of power semiconductor packages. Further, in an implementation, the second terminals coupled to the second nodes of the low-side switches for the respective plurality of power semiconductor packages may be electrically coupled to a reference voltage source.

Embodiments of power converters 4270, for example, may comprise a first plurality of power semiconductor packages coupled substantially in series via one or more intermediate voltage nodes between a higher voltage node and a lower voltage node and a second plurality of power semiconductor packages coupled substantially in parallel between the lower voltage node and a reference voltage node. In an implementation, the second plurality of power semiconductor packages may individually comprise a power transfer path including a high-side switch and a low-side switch, wherein a first node of the high-side switch may be coupled to the lower voltage node and wherein a second node of the low-side switch may be coupled to the reference voltage node. A high-side switch terminal may be coupled to a second node of the high-side switch and a low-side switch terminal may be coupled to a first node of the low-side switch, wherein the high-side switch terminal and/or the low-side switch terminal may be electrically coupled to at least one of the one or more intermediate voltage nodes, for example.

In particular embodiments, a power converter, such as power converter(s) 4270, for example, may include a plurality of power semiconductor packages including one or more first power semiconductor packages and one or more second semiconductor packages. In an implementation, one or more first power semiconductor packages may be substantially formed of different material and/or may be formed via substantially different processes than the one or more second semiconductor packages. Further, one or more first power semiconductor packages may individually comprise a power transfer path comprising at least a high-side switch and a low-side switch, for example. Additionally, in an implementation, one or more first power semiconductor packages may include one or more silicon-based integrated circuits and one or more second power semiconductor packages may include one or more integrated circuits substantially formed from gallium arsenide or gallium nitride, or a combination thereof, for example. Further, the one or more first power semiconductor packages may include one or more integrated circuits comprising a first plurality of metal layers and the one or more second power semiconductor packages may include one or more integrated circuits comprising a second plurality of metal layers, wherein the first plurality of metal layers exceeds the second plurality of metal layers, in an implementation.

In other embodiments, a power converter, such as power converter(s) 4270, for example, may comprise a plurality of power semiconductor packages, wherein the plurality of power semiconductor packages individually comprise a power transfer path comprising at least a high-side switch and a low-side switch, and wherein at least one of the plurality of power semiconductor packages comprises at least one controller to affect operation of the respective high-side switches and low-side switches of the plurality of power semiconductor packages. In an implementation, a controller of a first of the plurality of power semiconductor packages may provide at least one control signal to at least one other of the plurality of power semiconductor packages. Further, in an implementation, the at least one controller may implement a plurality of modes of operation. For example, the plurality of modes of operation may include a normal mode, a start-up mode, a shut-down mode or a sleep mode, or any combination thereof. In an implementation, the at least one controller of the at least one of the plurality of power semiconductor packages may signal a shut-down mode to at least another of the plurality of power semiconductor packages responsive at least in part to a fault detection or to a temperature event detection, or a combination thereof. In an additional implementation, the at least one controller of the at least one of the plurality of power semiconductor packages may signal a start-up mode of operation to at least another of the plurality of power semiconductor packages at least in part to precharge one or more capacitors of the plurality of power semiconductor packages. Further, in an implementation, the at least one controller of the at least one of the plurality of power semiconductor packages may signal a sleep mode of operation to at least another of the plurality of power semiconductor packages at least in part to maintain a specified charge on one or more capacitors of the plurality of power semiconductor packages.

Further embodiments may comprise a package including a plurality of terminals coupled to one or more integrated circuits positioned within the package, wherein the one or more integrated circuits comprise a power transfer path including a high-side switch and a low-side switch, and wherein the plurality of terminals comprise one or more first terminals coupled to a first node of the high-side switch, one or more second terminals coupled to a second node of the low-side switch, one or more high-side switch terminals coupled to a second node of the high-side switch, and one or more low-side switch terminals coupled to a first node of the low-side switch, for example. In an implementation, a package may comprise a ball grid array wherein the plurality of terminals may comprise a plurality of electrically conductive pads. Also, in an implementation, one or more first terminals coupled to the first node of the high-side switch comprise multiple rows of first terminals and wherein the one or more second terminals coupled to the second node of the low-side switch comprise multiple rows of second terminals, wherein the multiple rows of the first terminals individually comprise a plurality of first terminals and wherein the multiple rows of the second terminals individually comprise a plurality of second terminals. In an implementation, the one or more high-side switch terminals may comprise multiple rows of high-side switch terminals and the one or more low-side switch terminals may comprise multiple rows of low-side switch terminals. Further, in an implementation, the multiple rows of high-side switch terminals may individually comprise a plurality of high-side switch terminals and the multiple rows of low-side switch terminals may individually comprise a plurality of low-side switch terminals.

In other embodiments, a power converter, such as power converter(s) 4270, for example, may comprise a charge pump circuit including one or more power semiconductor packages, wherein the one or more power semiconductor packages may respectively comprise: a power transfer path including at least first, second and third power switching devices; a higher voltage terminal coupled to a first node of the first power switching device; a lower voltage terminal coupled to a second node of the third power switching device; a first switch terminal coupled to a second node of the first power switching device and a first node of the second power switching device; and a second switch terminal coupled to a second node of the second power switching device and a first node of the third. In an implementation, the charge pump circuit may further include one or more additional power semiconductor devices respectively comprising power transfer paths having at least two power switching devices. In an implementation, the one or more power semiconductor packages may comprises at least two power semiconductor packages respectively comprising the at least the first, second and third power switching devices. Further, in an implementation, the at least the first, second and third power switching devices are arranged in a stacked fashion within an encapsulating material. In another implementation, the at least the first, second and third power switching devices are arranged in a side-by-side, or horizontal, fashion within an encapsulating material.

In another embodiment, a power converter, such as power converter(s) 4270, for example, may comprise a charge pump circuit including a plurality of power semiconductor packages, including one or more single-switch power semiconductor packages, and further including one or more multiple-switch power semiconductor packages. In an implementation, the charge pump may include four single-switch power semiconductor devices and two two-switch power semiconductor devices. Also, in an implementation, the charge pump circuit may comprise a switched-capacitor charge pump circuit.

Further, an embodiment of a power converter, such as power converter(s) 4270, for example, may include a plurality of power semiconductor packages, wherein the plurality of power semiconductor packages individually comprise power transfer paths including comprising at least one power switching device, and may also include a controller located external to the plurality of power semiconductor devices to affect operation of the plurality of power semiconductor packages.

FIG. 22 is a schematic diagram illustrating features associated with an implementation of an example operating environment 4300 capable of facilitating and/or supporting one or more operations and/or techniques for infrastructure for updating and/or managing IoT-type devices, illustrated generally herein at 4302. As was indicated, the IoT is typically a system of interconnected and/or internetworked physical devices in which computing may be embedded into hardware so as to facilitate and/or support devices' abilities to acquire, collect and/or communicate content over one or more communications networks, for example, at times, without human participation and/or interaction. As mentioned, IoT-type devices may include a wide variety of stationary and/or mobile devices, such as, for example, automobile sensors, biochip transponders, heart monitoring implants, kitchen appliances, locks or like fastening devices, solar panel arrays, home gateways, smart gauges, smart telephones, cellular telephones, security cameras, wearable devices, thermostats, Global Positioning System (GPS) transceivers, personal digital assistants (PDAs), virtual assistants, laptop computers, personal entertainment systems, tablet personal computers (PCs), PCs, personal audio and/or video devices, personal navigation devices, and/or the like.

It should be appreciated that operating environment 4300 is described herein as a non-limiting example that may be implemented, in whole or in part, in a context of various wired and/or wireless communications networks and/or any suitable portion and/or combination of such networks. Thus, for a particular implementation, one or more operations and/or techniques for updating and/or managing IoT-type devices may be performed, at least in part, in an indoor environment and/or an outdoor environment, or any combination thereof.

Thus, as illustrated, in a particular implementation, one or more IoT-type devices 4302 may, for example, receive and/or acquire satellite positioning system (SPS) signals 4304 from SPS satellites 4306. In some instances, SPS satellites 4306 may be from a single global navigation satellite system (GNSS), such as the GPS or Galileo satellite systems, for example. In other instances, SPS satellites 4306 may be from multiple GNSS such as, but not limited to, GPS, Galileo, Glonass, or Beidou (Compass) satellite systems, for example. In certain implementations, SPS satellites 4306 may be from any one several regional navigation satellite systems (RNSS) such as, for example, WAAS, EGNOS, QZSS, just to name a few examples.

At times, one or more IoT-type devices 4302 may, for example, transmit wireless signals to and/or receive wireless signals from a suitable wireless communication network. In one example, one or more IoT-type devices 4302 may communicate with a cellular communication network, such as by transmitting wireless signals to and/or receiving wireless signals from one or more wireless transmitters capable of transmitting and/or receiving wireless signals, such as a base station transceiver 4308 over a wireless communication link 4310, for example. Similarly, one or more IoT-type devices 4302 may transmit wireless signals to and/or receive wireless signals from a local transceiver 4312 over a wireless communication link 4314, for example. Base station transceiver 4308, local transceiver 4312, etc. may be of the same or similar type, for example, and/or may represent different types of devices, such as access points, radio beacons, cellular base stations, femtocells, an access transceiver device, or the like, depending on an implementation. Similarly, local transceiver 4312 may comprise, for example, a wireless transmitter and/or receiver capable of transmitting and/or receiving wireless signals. For example, at times, wireless transceiver 4312 may be capable of transmitting and/or receiving wireless signals from one or more other terrestrial transmitters and/or receivers.

In a particular implementation, local transceiver 4312 may, for example, be capable of communicating with one or more IoT-type devices 4302 at a shorter range over wireless communication link 4314 than at a range established via base station transceiver 4308 over wireless communication link 4310. For example, local transceiver 4312 may be positioned in an indoor or like environment and/or may provide access to a wireless local area network (WLAN, e.g., IEEE Std. 802.11 network, etc.) and/or wireless personal area network (WPAN, e.g., Bluetooth® network, etc.). In another example implementation, local transceiver 4312 may comprise a femtocell and/or picocell capable of facilitating communication via link 4314 according to an applicable cellular or like wireless communication protocol. Again, it should be understood that these are merely examples of networks that may communicate with one or more IoT-type devices 4302 over a wireless link, and claimed subject matter is not limited in this respect. For example, in some instances, operating environment 4300 may include a larger number of base station transceivers 4308, local transceivers 4312, networks, terrestrial transmitters and/or receivers, etc.

In an implementation, one or more IoT-type devices 4302, base station transceiver 4308, local transceiver 4312, etc. may, for example, communicate with one or more servers, referenced herein at 4316, 4318, and 4320, over a network 4322, such as via one or more communication links 4324. Network 4322 may comprise, for example, any combination of wired and/or wireless communication links. In a particular implementation, network 4322 may comprise, for example, Internet Protocol (IP)-type infrastructure capable of facilitating or supporting communication between one or more IoT-type devices 4302 and one or more servers 4316, 4318, 4320, etc. via local transceiver 4312, base station transceiver 4308, directly, etc. In another implementation, network 4322 may comprise, for example cellular communication network infrastructure, such as a base station controller and/or master switching center to facilitate and/or support mobile cellular communication with one or more IoT-type devices 4302. Servers 4316, 4318 and/or 4320 may comprise any suitable servers or combination thereof capable of facilitating or supporting one or more operations and/or techniques discussed herein. For example, servers 4316, 4318 and/or 4320 may comprise one or more update servers, back-end servers, management servers, archive servers, location servers, positioning assistance servers, navigation servers, map servers, crowdsourcing servers, network-related servers, or the like. In particular implementations, servers 4316, 4318 and/or 4320 may be supplied power by one or more example power converters such as described herein, for example.

Even though a certain number of computing platforms and/or devices are illustrated herein, any number of suitable computing platforms and/or devices may be implemented to facilitate and/or support one or more techniques and/or processes associated with operating environment 4300. For example, at times, network 4322 may be coupled to one or more wired and/or wireless communication networks (e.g., WLAN, etc.) so as to enhance a coverage area for communications with one or more IoT-type devices 4302, one or more base station transceivers 4308, local transceiver 4312, servers 4316, 4318, 4320, or the like. In some instances, network 4322 may facilitate and/or support femtocell-based operative regions of coverage, for example. Again, these are merely example implementations, and claimed subject matter is not limited in this regard.

In the context of the present patent application, the term "connection," the term "component" and/or similar terms are intended to be physical, but are not necessarily always tangible. Whether or not these terms refer to tangible subject matter, thus, may vary in a particular context of usage. As an example, a tangible connection and/or tangible connection path may be made, such as by a tangible, electrical connection, such as an electrically conductive path comprising metal or other conductor, that is able to conduct electrical current between two tangible components. Likewise, a tangible connection path may be at least partially affected and/or controlled, such that, as is typical, a tangible connection path may be open or closed, at times resulting from influence of one or more externally derived signals, such as external currents and/or voltages, such as for an electrical switch. Non-limiting illustrations of an electrical switch include a transistor, a diode, etc. However, a "connection" and/or "component," in a particular context of usage, likewise, although physical, can also be non-tangible, such as a connection between a client and a server over a network, particularly a wireless network, which generally refers to the ability for the client and server to transmit, receive, and/or exchange communications, as discussed in more detail later.

In a particular context of usage, such as a particular context in which tangible components are being discussed, therefore, the terms "coupled" and "connected" are used in a manner so that the terms are not synonymous. Similar terms may also be used in a manner in which a similar intention is exhibited. Thus, "connected" is used to indicate that two or more tangible components and/or the like, for example, are tangibly in direct physical contact. Thus, using the previous example, two tangible components that are electrically connected are physically connected via a tangible electrical connection, as previously discussed. However, "coupled," is used to mean that potentially two or more tangible components are tangibly in direct physical contact. Nonetheless, "coupled" is also used to mean that two or more tangible components and/or the like are not necessarily tangibly in direct physical contact, but are able to co-operate, liaise, and/or interact, such as, for example, by being "optically coupled." Likewise, the term "coupled" is also understood to mean indirectly connected. It is further noted, in the context of the present patent application, since memory, such as a memory component and/or memory states, is intended to be non-transitory, the term physical, at least if used in relation to memory necessarily implies that such memory components and/or memory states, continuing with the example, are tangible.

Additionally, in the present patent application, in a particular context of usage, such as a situation in which tangible components (and/or similarly, tangible materials) are being discussed, a distinction exists between being "on" and being "over." As an example, deposition of a substance "on" a substrate refers to a deposition involving direct physical and tangible contact without an intermediary, such as an intermediary substance, between the substance deposited and the substrate in this latter example; nonetheless, deposition "over" a substrate, while understood to potentially include deposition "on" a substrate (since being "on" may also accurately be described as being "over"), is understood to include a situation in which one or more intermediaries, such as one or more intermediary substances, are present between the substance deposited and the substrate so that the substance deposited is not necessarily in direct physical and tangible contact with the substrate.

A similar distinction is made in an appropriate particular context of usage, such as in which tangible materials and/or tangible components are discussed, between being "beneath" and being "under." While "beneath," in such a particular context of usage, is intended to necessarily imply physical and tangible contact (similar to "on," as just described), "under" potentially includes a situation in which there is direct physical and tangible contact, but does not necessarily imply direct physical and tangible contact, such as if one or more intermediaries, such as one or more intermediary substances, are present. Thus, "on" is understood to mean "immediately over" and "beneath" is understood to mean "immediately under."

It is likewise appreciated that terms such as "over" and "under" are understood in a similar manner as the terms "up," "down," "top," "bottom," and so on, previously mentioned. These terms may be used to facilitate discussion, but are not intended to necessarily restrict scope of claimed subject matter. For example, the term "over," as an example, is not meant to suggest that claim scope is limited to only situations in which an embodiment is right side up, such as in comparison with the embodiment being upside down, for example. An example includes a flip chip, as one illustration, in which, for example, orientation at various times (e.g., during fabrication) may not necessarily correspond to orientation of a final product. Thus, if an object, as an example, is within applicable claim scope in a particular orientation, such as upside down, as one example, likewise, it is intended that the latter also be interpreted to be included within applicable claim scope in another orientation, such as right side up, again, as an example, and vice-versa, even if applicable literal claim language has the potential to be interpreted otherwise. Of course, again, as always has been the case in the specification of a patent application, particular context of description and/or usage provides helpful guidance regarding reasonable inferences to be drawn.

Unless otherwise indicated, in the context of the present patent application, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Likewise, the term "based on"

and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, that the particular situation be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques unless otherwise expressly indicated.

It is noted, nonetheless, that a typical measurement model employed is that one or more measurements may respectively comprise a sum of at least two components. Thus, for a given measurement, for example, one component may comprise a deterministic component, which in an ideal sense, may comprise a physical value (e.g., sought via one or more measurements), often in the form of one or more signals, signal samples and/or states, and one component may comprise a random component, which may have a variety of sources that may be challenging to quantify. At times, for example, lack of measurement precision may affect a given measurement. Thus, for claimed subject matter, a statistical or stochastic model may be used in addition to a deterministic model as an approach to identification and/or prediction regarding one or more measurement values that may relate to claimed subject matter.

A "signal measurement" and/or a "signal measurement vector" may be referred to respectively as a "random measurement" such that the term "random" may be understood in context with respect to the fields of probability, random variables and/or stochastic processes. Random variables may comprise signal value measurements, which may, for example, be specified in a space of outcomes. Thus, in some contexts, a probability (e.g., likelihood) may be assigned to outcomes, as often may be used in connection with approaches employing probability and/or statistics. In other contexts, a random variable may be substantially in accordance with a measurement comprising a deterministic measurement value or, perhaps, an average measurement component plus random variation about a measurement average. The terms "measurement vector," "random vector," and/or "vector" are used throughout this document interchangeably. In an embodiment, a random vector, or portion thereof, comprising one or more measurement vectors may uniquely be associated with a distribution of scalar numerical values, such as random scalar numerical values (e.g., signal values and/or signal sample values), for example. Thus, it is understood, of course, that a distribution of scalar numerical values, for example, without loss of generality, substantially in accordance with the foregoing description and/or later description, is related to physical measurements, and is likewise understood to exist as physical signals and/or physical signal samples.

The terms "correspond", "reference", "associate", and/or similar terms relate to signals, signal samples and/or states, e.g., components of a signal measurement vector, which may be stored in memory and/or employed with operations to generate results, depending, at least in part, on the above-mentioned, signal samples and/or signal sample states. For example, a signal sample measurement vector may be stored in a memory location and further referenced wherein such a reference may be embodied and/or described as a stored relationship. A stored relationship may be employed by associating (e.g., relating) one or more memory addresses to one or more another memory addresses, for example, and may facilitate an operation, involving, at least in part, a combination of signal samples and/or states stored in memory, such as for processing by a processor and/or similar device, for example. Thus, in a particular context, "associating," "referencing," and/or "corresponding" may, for example, refer to an executable process of accessing memory contents of two or more memory locations, e.g., to facilitate execution of one or more operations among signal samples and/or states, wherein one or more results of the one or more operations may likewise be employed for additional processing, such as in other operations, or may be stored in the same or other memory locations, as may, for example, be directed by executable instructions. Furthermore, terms "fetching" and "reading" or "storing" and "writing" are to be understood as interchangeable terms for the respective operations, e.g., a result may be fetched (or read) from a memory location; likewise, a result may be stored in (or written to) a memory location.

It is further noted that the terms "type" and/or "like," if used, such as with a feature, structure, characteristic, and/or the like, using "optical" or "electrical" as simple examples, means at least partially of and/or relating to the feature, structure, characteristic, and/or the like in such a way that presence of minor variations, even variations that might otherwise not be considered fully consistent with the feature, structure, characteristic, and/or the like, do not in general prevent the feature, structure, characteristic, and/or the like from being of a "type" and/or being "like," (such as being an "optical-type" or being "optical-like," for example) if the minor variations are sufficiently minor so that the feature, structure, characteristic, and/or the like would still be considered to be substantially present with such variations also present. Thus, continuing with this example, the terms optical-type and/or optical-like properties are necessarily intended to include optical properties. Likewise, the terms electrical-type and/or electrical-like properties, as another example, are necessarily intended to include electrical properties. It should be noted that the specification of the present patent application merely provides one or more illustrative examples and claimed subject matter is intended to not be limited to one or more illustrative examples; however, again, as has always been the case with respect to the specification of a patent application, particular context of description and/or usage provides helpful guidance regarding reasonable inferences to be drawn.

With advances in technology, it has become more typical to employ distributed computing and/or communication approaches in which portions of a process, such as signal processing of signal samples, for example, may be allocated among various devices, including one or more client devices and/or one or more server devices, via a computing and/or communications network, for example. A network may comprise two or more devices, such as network devices and/or computing devices, and/or may couple devices, such as network devices and/or computing devices, so that signal communications, such as in the form of signal packets and/or signal frames (e.g., comprising one or more signal samples), for example, may be exchanged, such as between a server device and/or a client device, as well as other types of devices, including between wired and/or wireless devices coupled via a wired and/or wireless network, for example.

In the context of the present patent application, the term network device refers to any device capable of communicating via and/or as part of a network and may comprise a computing device. While network devices may be capable of communicating signals (e.g., signal packets and/or frames), such as via a wired and/or wireless network, they may also be capable of performing operations associated with a computing device, such as arithmetic and/or logic operations, processing and/or storing operations (e.g., storing signal samples), such as in memory as tangible, physical memory states, and/or may, for example, operate as a server device and/or a client device in various embodiments. Network devices capable of operating as a server device, a client device and/or otherwise, may include, as examples, dedicated rack-mounted servers, desktop computers, laptop computers, set top boxes, tablets, ultrabooks, smart phones, wearable devices, integrated devices combining two or more features of the foregoing devices, and/or the like, or any combination thereof. As mentioned, signal packets and/or frames, for example, may be exchanged, such as between a server device and/or a client device, as well as other types of devices, including between wired and/or wireless devices coupled via a wired and/or wireless network, for example, or any combination thereof. It is noted that the terms, server, server device, server computing device, server computing platform and/or similar terms are used interchangeably. Similarly, the terms client, client device, client computing device, client computing platform and/or similar terms are also used interchangeably. While in some instances, for ease of description, these terms may be used in the singular, such as by referring to a "client device" or a "server device," the description is intended to encompass one or more client devices and/or one or more server devices, as appropriate. Along similar lines, references to a "database" are understood to mean, one or more databases and/or portions thereof, as appropriate.

It should be understood that for ease of description, a network device (also referred to as a networking device) may be embodied and/or described in terms of a computing device and vice-versa. However, it should further be understood that this description should in no way be construed so that claimed subject matter is limited to one embodiment, such as only a computing device and/or only a network device, but, instead, may be embodied as a variety of devices or combinations thereof, including, for example, one or more illustrative examples.

A network may also include now known, and/or to be later developed arrangements, derivatives, and/or improvements, including, for example, past, present and/or future mass storage, such as network attached storage (NAS), a storage area network (SAN), and/or other forms of device readable media, for example. A network may include a portion of the Internet, one or more local area networks (LANs), one or more wide area networks (WANs), wire-line type connections, wireless type connections, other connections, or any combination thereof. Thus, a network may be worldwide in scope and/or extent. Likewise, sub-networks, such as may employ differing architectures and/or may be substantially compliant and/or substantially compatible with differing protocols, such as network computing and/or communications protocols (e.g., network protocols), may interoperate within a larger network.

Although claimed subject matter is not in particular limited in scope to the Internet and/or to the Web; nonetheless, the Internet and/or the Web may without limitation provide a useful example of an embodiment at least for purposes of illustration.

It is further noted an association of memory states, for example, may be in a logical sense and not necessarily in a tangible, physical sense. Thus, although signal and/or state components of a file and/or an electronic document, for example, are to be associated logically, storage thereof, for example, may reside in one or more different places in a tangible, physical memory, in an embodiment.

In the context of the present patent application, the terms "entry," "electronic entry," "document," "electronic document," "content,", "digital content," "item," and/or similar terms are meant to refer to signals and/or states in a physical format, such as a digital signal and/or digital state format, e.g., that may be perceived by a user if displayed, played, tactilely generated, etc. and/or otherwise executed by a device, such as a digital device, including, for example, a computing device, but otherwise might not necessarily be readily perceivable by humans (e.g., if in a digital format). Likewise, in the context of the present patent application, digital content provided to a user in a form so that the user is able to readily perceive the underlying content itself (e.g., content presented in a form consumable by a human, such as hearing audio, feeling tactile sensations and/or seeing images, as examples) is referred to, with respect to the user, as "consuming" digital content, "consumption" of digital content, "consumable" digital content and/or similar terms. For one or more embodiments, an electronic document and/or an electronic file may comprise a Web page of code (e.g., computer instructions) in a markup language executed or to be executed by a computing and/or networking device, for example. In another embodiment, an electronic document and/or electronic file may comprise a portion and/or a region of a Web page. However, claimed subject matter is not intended to be limited in these respects.

Also, for one or more embodiments, an electronic document and/or electronic file may comprise a number of components. As previously indicated, in the context of the present patent application, a component is physical, but is not necessarily tangible. As an example, components with reference to an electronic document and/or electronic file, in one or more embodiments, may comprise text, for example, in the form of physical signals and/or physical states (e.g., capable of being physically displayed). Typically, memory states, for example, comprise tangible components, whereas physical signals are not necessarily tangible, although signals may become (e.g., be made) tangible, such as if appearing on a tangible display, for example, as is not uncommon. Also, for one or more embodiments, components with reference to an electronic document and/or electronic file may comprise a graphical object, such as, for example, an image, such as a digital image, and/or sub-objects, including attributes thereof, which, again, comprise physical signals and/or physical states (e.g., capable of being tangibly displayed). In an embodiment, digital content may comprise, for example, text, images, audio, video, and/or other types of electronic documents and/or electronic files, including portions thereof, for example.

Also, in the context of the present patent application, the term parameters (e.g., one or more parameters) refer to material descriptive of a collection of signal samples, such as one or more electronic documents and/or electronic files, and exist in the form of physical signals and/or physical states, such as memory states.

Signal packet communications and/or signal frame communications, also referred to as signal packet transmissions and/or signal frame transmissions (or merely "signal packets" or "signal frames"), may be communicated between nodes of a network, where a node may comprise one or more network devices and/or one or more computing devices, for example. As an illustrative example, but without limitation, a node may comprise one or more sites employing a local network address, such as in a local network address space. Likewise, a device, such as a network device and/or a computing device, may be associated with that node. It is also noted that in the context of this patent application, the term "transmission" is intended as another term for a type of signal communication that may occur in any one of a variety of situations. Thus, it is not intended to imply a particular directionality of communication and/or a particular initiating end of a communication path for the "transmission" communication. For example, the mere use of the term in and of itself is not intended, in the context of the present patent application, to have particular implications with respect to the one or more signals being communicated, such as, for example, whether the signals are being communicated "to" a particular device, whether the signals are being communicated "from" a particular device, and/or regarding which end of a communication path may be initiating communication, such as, for example, in a "push type" of signal transfer or in a "pull type" of signal transfer. In the context of the present patent application, push and/or pull type signal transfers are distinguished by which end of a communications path initiates signal transfer.

Thus, a signal packet and/or frame may, as an example, be communicated via a communication channel and/or a communication path, such as comprising a portion of the Internet and/or the Web, from a site via an access node coupled to the Internet or vice-versa. Likewise, a signal packet and/or frame may be forwarded via network nodes to a target site coupled to a local network, for example. A signal packet and/or frame communicated via the Internet and/or the Web, for example, may be routed via a path, such as either being "pushed" or "pulled," comprising one or more gateways, servers, etc. that may, for example, route a signal packet and/or frame, such as, for example, substantially in accordance with a target and/or destination address and availability of a network path of network nodes to the target and/or destination address. Although the Internet and/or the Web comprise a network of interoperable networks, not all of those interoperable networks are necessarily available and/or accessible to the public.

In the context of the particular patent application, a network protocol, such as for communicating between devices of a network, may be characterized, at least in part, substantially in accordance with a layered description, such as the so-called Open Systems Interconnection (OSI) seven layer type of approach and/or description. A network computing and/or communications protocol (also referred to as a network protocol) refers to a set of signaling conventions, such as for communication transmissions, for example, as may take place between and/or among devices in a network. In the context of the present patent application, the term "between" and/or similar terms are understood to include "among" if appropriate for the particular usage and vice-versa. Likewise, in the context of the present patent application, the terms "compatible with," "comply with" and/or similar terms are understood to respectively include substantial compatibility and/or substantial compliance.

A network protocol, such as protocols characterized substantially in accordance with the aforementioned OSI description, has several layers. These layers are referred to as a network stack. Various types of communications (e.g., transmissions), such as network communications, may occur across various layers. A lowest level layer in a network stack, such as the so-called physical layer, may characterize how symbols (e.g., bits and/or bytes) are communicated as one or more signals (and/or signal samples) via a physical medium (e.g., twisted pair copper wire, coaxial cable, fiber optic cable, wireless air interface, combinations thereof, etc.). Progressing to higher-level layers in a network protocol stack, additional operations and/or features may be available via engaging in communications that are substantially compatible and/or substantially compliant with a particular network protocol at these higher-level layers. For example, higher-level layers of a network protocol may, for example, affect device permissions, user permissions, etc.

A network and/or sub-network, in an embodiment, may communicate via signal packets and/or signal frames, such as via participating digital devices and may be substantially compliant and/or substantially compatible with, but is not limited to, now known and/or to be developed, versions of any of the following network protocol stacks: ARCNET, ATM, Bluetooth, DECnet, Ethernet, FDDI, Frame Relay, HIPPI, IEEE 1394, IEEE 802.11, IEEE-488, Internet Protocol Suite, IPX, Myrinet, OSI Protocol Suite, QsNet, RS-232, SPX, System Network Architecture, Token Ring, USB, and/or X.25. A network and/or sub-network may employ, for example, a version, now known and/or later to be developed, of the following: TCP/IP, UDP, DECnet, NetBEUI, IPX and/or the like. Versions of the Internet Protocol (IP) may include IPv4, IPv6, and/or other later to be developed versions.

Regarding aspects related to a network, including a communications and/or computing network, a wireless network may couple devices, including client devices, with the network. A wireless network may employ stand-alone, ad-hoc networks, mesh networks, Wireless LAN (WLAN) networks, cellular networks, and/or the like. A wireless network may further include a system of terminals, gateways, routers, and/or the like coupled by wireless radio links, and/or the like, which may move freely, randomly and/or organize themselves arbitrarily, such that network topology may change, at times even rapidly. A wireless network may further employ a plurality of network access technologies, including a version of Long Term Evolution (LTE), WLAN, Wireless Router (WR) mesh, 2nd, 3rd, or 4th generation (2G, 3G, 4G, or 5G) cellular technology and/or the like, whether currently known and/or to be later developed. Network access technologies may enable wide area coverage for devices, such as computing devices and/or network devices, with varying degrees of mobility, for example.

A network may enable radio frequency and/or other wireless type communications via a wireless network access technology and/or air interface, such as Global System for Mobile communication (GSM), Universal Mobile Telecommunications System (UMTS), General Packet Radio Services (GPRS), Enhanced Data GSM Environment (EDGE), 3GPP Long Term Evolution (LTE), LTE Advanced, Wideband Code Division Multiple Access (WCDMA), Bluetooth, ultra-wideband (UWB), 5G, 802.11b/g/n, and/or the like. A wireless network may include virtually any type of now known and/or to be developed wireless communication mechanism and/or wireless communications protocol by which signals may be communicated between devices, between networks, within a network, and/or the like, including the foregoing, of course.

In one example embodiment, as shown in FIG. 23, a system embodiment may comprise a local network (e.g., device 4404 and medium 4440) and/or another type of network, such as a computing and/or communications network. For purposes of illustration, therefore, FIG. 23 shows an embodiment 4400 of a system that may be employed to implement either type or both types of networks. Network 208 may comprise one or more network connections, links, processes, services, applications, and/or resources to facilitate and/or support communications, such as an exchange of communication signals, for example, between a computing device, such as 4402, and another computing device, such as 4406, which may, for example, comprise one or more client computing devices and/or one or more server computing device. By way of example, but not limitation, network 4408 may comprise wireless and/or wired communication links, telephone and/or telecommunications systems, Wi-Fi networks, Wi-MAX networks, the Internet, a local area network (LAN), a wide area network (WAN), or any combinations thereof.

Example devices in FIG. 23 may comprise features, for example, of a client computing device and/or a server computing device, in an embodiment. It is further noted that the term computing device, in general, whether employed as a client and/or as a server, or otherwise, refers at least to a processor and a memory connected by a communication bus. A "processor," for example, is understood to connote a specific structure such as a central processing unit (CPU), digital signal processor (DSP) or graphics processing unit (GPU), or any combination thereof, of a computing device which may include a control unit and an execution unit. In some implementations, a processor may combine elements and/or functionality of one or more CPUs, one or more GPUs and/or one or more DSPs, for example. In an aspect, a processor may comprise a device that interprets and executes instructions to process input signals to provide output signals. As such, in the context of the present patent application at least, computing device and/or processor are understood to refer to sufficient structure within the meaning of 35 USC § 112 (f) so that it is specifically intended that 35 USC § 112 (f) not be implicated by use of the term "computing device," "processor" and/or similar terms; however, if it is determined, for some reason not immediately apparent, that the foregoing understanding cannot stand and that 35 USC § 112 (f), therefore, necessarily is implicated by the use of the term "computing device," "processor" and/or similar terms, then, it is intended, pursuant to that statutory section, that corresponding structure, material and/or acts for performing one or more functions be understood and be interpreted to be described at least in some of the various figures and in the text associated with the various figures of the present patent application.

Referring now to FIG. 23, in an embodiment, first and third devices 4402 and 4406 may be capable of rendering a graphical user interface (GUI) for a network device and/or a computing device, for example, so that a user-operator may engage in system use. Device 4404 may potentially serve a similar function in this illustration. Likewise, in FIG. 23, computing device 4402 ('first device' in figure) may interface with computing device 4404 ('second device' in figure), which may, for example, also comprise features of a client computing device and/or a server computing device, in an embodiment. Processor (e.g., processing device) 4420 and memory 4422, which may comprise primary memory 4424 and secondary memory 4426, may communicate by way of a communication bus 4415, for example. The term "computing device," in the context of the present patent application, refers to a system and/or a device, such as a computing apparatus, that includes a capability to process (e.g., perform computations) and/or store digital content, such as electronic files, electronic documents, measurements, text, images, video, audio, etc. in the form of signals and/or states. Thus, a computing device, in the context of the present patent application, may comprise hardware, software, firmware, or any combination thereof (other than software per se). Computing device 4404, as depicted in FIG. 23, is merely one example, and claimed subject matter is not limited in scope to this particular example.

For one or more embodiments, a device, such as a computing device and/or networking device, may comprise, for example, any of a wide range of digital electronic devices, including, but not limited to, desktop and/or notebook computers, high-definition televisions, digital video players and/or recorders, game consoles, satellite television receivers, cellular telephones, tablet devices, wearable devices, personal digital assistants, mobile audio and/or video playback and/or recording devices, Internet of Things (IoT) type devices, or any combination of the foregoing. Further, unless specifically stated otherwise, a process as described, such as with reference to flow diagrams and/or otherwise, may also be executed and/or affected, in whole or in part, by a computing device and/or a network device. A device, such as a computing device and/or network device, may vary in terms of capabilities and/or features. Claimed subject matter is intended to cover a wide range of potential variations. For example, a device may include a numeric keypad and/or other display of limited functionality, such as a monochrome liquid crystal display (LCD) for displaying text, for example. In contrast, however, as another example, a web-enabled device may include a physical and/or a virtual keyboard, mass storage, one or more accelerometers, one or more gyroscopes, global positioning system (GPS) and/or other location-identifying type capability, and/or a display with a higher degree of functionality, such as a touch-sensitive color 2D or 3D display, for example.

As suggested previously, communications between a computing device and/or a network device and a wireless network may be in accordance with known and/or to be developed network protocols including, for example, global system for mobile communications (GSM), enhanced data rate for GSM evolution (EDGE), 802.11b/g/n/h, etc., and/or worldwide interoperability for microwave access (WiMAX).

In FIG. 23, computing device 4402 may provide one or more sources of executable computer instructions in the form physical states and/or signals (e.g., stored in memory states), for example. Computing device 4402 may communicate with computing device 4404 by way of a network connection, such as via network 4408, for example. As previously mentioned, a connection, while physical, may not necessarily be tangible. Although computing device 4404 of FIG. 23 shows various tangible, physical components, claimed subject matter is not limited to a computing devices having only these tangible components as other implementations and/or embodiments may include alternative arrangements that may comprise additional tangible components or fewer tangible components, for example, that function differently while achieving similar results. Rather, examples are provided merely as illustrations. It is not intended that claimed subject matter be limited in scope to illustrative examples.

In particular implementations, one or more of computing devices 4402, 4404 and/or 4406 may include one or more power converter circuits, such as one or more example circuits described herein. In particular implementations, power converter circuits, such as one or more example circuits described herein, may be utilized to provide power to any of a wide range of circuit types, processors, memory devices, communication interfaces, etc. Further, in particular implementations, one or more of computing devices 4402, 4404 and/or 4406 may include circuitry, processors, oscillators, etc., to control various functionalities and/or operations related to power converters. Of course, embodiments are limited in scope in these respects.

Memory 4422 may comprise any non-transitory storage mechanism. Memory 4422 may comprise, for example, primary memory 4424 and secondary memory 4426, additional memory circuits, mechanisms, or combinations thereof may be used. Memory 4422 may comprise, for example, random access memory, read only memory, etc., such as in the form of one or more storage devices and/or systems, such as, for example, a disk drive including an optical disc drive, a tape drive, a solid-state memory drive, etc., just to name a few examples.

Memory 4422 may be utilized to store a program of executable computer instructions. For example, processor 4420 may fetch executable instructions from memory and proceed to execute the fetched instructions. Memory 4422 may also comprise a memory controller for accessing device readable-medium 4440 that may carry and/or make accessible digital content, which may include code, and/or instructions, for example, executable by processor 4420 and/or some other device, such as a controller, as one example, capable of executing computer instructions, for example. Under direction of processor 4420, a non-transitory memory, such as memory cells storing physical states (e.g., memory states), comprising, for example, a program of executable computer instructions, may be executed by processor 4420 and able to generate signals to be communicated via a network, for example, as previously described. Generated signals may also be stored in memory, also previously suggested.

Memory 4422 may store electronic files and/or electronic documents, such as relating to one or more users, and may also comprise a computer-readable medium that may carry and/or make accessible content, including code and/or instructions, for example, executable by processor 4420 and/or some other device, such as a controller, as one example, capable of executing computer instructions, for example. As previously mentioned, the term electronic file and/or the term electronic document are used throughout this document to refer to a set of stored memory states and/or a set of physical signals associated in a manner so as to thereby form an electronic file and/or an electronic document. That is, it is not meant to implicitly reference a particular syntax, format and/or approach used, for example, with respect to a set of associated memory states and/or a set of associated physical signals. It is further noted an association of memory states, for example, may be in a logical sense and not necessarily in a tangible, physical sense. Thus, although signal and/or state components of an electronic file and/or electronic document, are to be associated logically, storage thereof, for example, may reside in one or more different places in a tangible, physical memory, in an embodiment.

Algorithmic descriptions and/or symbolic representations are examples of techniques used by those of ordinary skill in the signal processing and/or related arts to convey the substance of their work to others skilled in the art. An algorithm is, in the context of the present patent application, and generally, is considered to be a self-consistent sequence of operations and/or similar signal processing leading to a desired result. In the context of the present patent application, operations and/or processing involve physical manipulation of physical quantities. Typically, although not necessarily, such quantities may take the form of electrical and/or magnetic signals and/or states capable of being stored, transferred, combined, compared, processed and/or otherwise manipulated, for example, as electronic signals and/or states making up components of various forms of digital content, such as signal measurements, text, images, video, audio, etc.

It has proven convenient at times, principally for reasons of common usage, to refer to such physical signals and/or physical states as bits, values, elements, parameters, symbols, characters, terms, numbers, numerals, measurements, content and/or the like. It should be understood, however, that all of these and/or similar terms are to be associated with appropriate physical quantities and are merely convenient labels. Unless specifically stated otherwise, as apparent from the preceding discussion, it is appreciated that throughout this specification discussions utilizing terms such as "processing," "computing," "calculating," "determining", "establishing", "obtaining", "identifying", "selecting", "generating", and/or the like may refer to actions and/or processes of a specific apparatus, such as a special purpose computer and/or a similar special purpose computing and/or network device. In the context of this specification, therefore, a special purpose computer and/or a similar special purpose computing and/or network device is capable of processing, manipulating and/or transforming signals and/or states, typically in the form of physical electronic and/or magnetic quantities, within memories, registers, and/or other storage devices, processing devices, and/or display devices of the special purpose computer and/or similar special purpose computing and/or network device. In the context of this particular patent application, as mentioned, the term "specific apparatus" therefore includes a general purpose computing and/or network device, such as a general purpose computer, once it is programmed to perform particular functions, such as pursuant to program software instructions.

In some circumstances, operation of a memory device, such as a change in state from a binary one to a binary zero or vice-versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation and/or storage of charge or a release of stored charge. Likewise, in other memory devices, a change of state may comprise a physical change, such as a transformation in magnetic orientation. Likewise, a physical change may comprise a transformation in molecular structure, such as from crystalline form to amorphous form or vice-versa. In still other memory devices, a change in physical state may involve quantum mechanical phenomena, such as, superposition, entanglement, and/or the like, which may involve quantum bits (qubits), for example. The foregoing is not intended to be an exhaustive list of all examples in which a change in state from a binary one to a binary zero or vice-versa in a memory device may comprise a transformation, such as a physical, but non-transitory, transformation. Rather, the foregoing is intended as illustrative examples.

Referring again to FIG. 23, processor 4420 may comprise one or more circuits, such as digital circuits, to perform at least a portion of a computing procedure and/or process. By way of example, but not limitation, processor 4420 may comprise one or more processors, such as controllers, microprocessors, microcontrollers, application specific integrated circuits, digital signal processors, programmable logic devices, field programmable gate arrays, the like, or any combination thereof. In various implementations and/or embodiments, processor 4420 may perform signal processing, typically substantially in accordance with fetched executable computer instructions, such as to manipulate signals and/or states, to construct signals and/or states, etc., with signals and/or states generated in such a manner to be communicated and/or stored in memory, for example.

FIG. 23 also illustrates device 4404 as including a component 4432 operable with input/output devices, for example, so that signals and/or states may be appropriately communicated between devices, such as device 4404 and an input device and/or device 4404 and an output device.

In the preceding description, various aspects of claimed subject matter have been described. For purposes of explanation, specifics, such as amounts, systems and/or configurations, as examples, were set forth. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all modifications and/or changes as fall within claimed subject matter.

What is claimed is:

1. An apparatus, comprising:
  a series-capacitor converter including a plurality of power semiconductor packages, wherein at least one package in the plurality of power semiconductor packages comprises:
    a power transfer path comprising at least a high-side switch and a low-side switch;
    a first terminal coupled to a first node of the high-side switch;
    a second terminal coupled to a second node of the low-side switch;
    a high-side switch terminal coupled to a second node of the high-side switch;
    a low-side switch terminal coupled to a first node of the low-side switch, wherein the high-side switch terminal and the low-side switch terminal comprise separate terminals; and
    a plurality of lead frame contacts for receiving control signals, the plurality of lead frame contacts being arranged along an edge of an individual power semiconductor package.

2. The apparatus of claim 1, wherein the plurality of power semiconductor packages individually further comprise:
  a high-side driver coupled to a control terminal of the high-side switch; and
  a low-side driver coupled to a control terminal of the low-side switch.

3. The apparatus of claim 2, wherein the plurality of power semiconductor packages individually further comprise:
  a first boot supply terminal coupled to the high-side driver; and
  a second boot supply terminal coupled to the low-side driver, wherein the first boot supply terminal is separate from the second boot supply terminal.

4. The apparatus of claim 3, wherein the series-capacitor converter further comprises:
  at least one first boot capacitor coupled between the high-side switch terminal and the first boot supply terminal for a respective at least a first one of the plurality of power semiconductor packages; and
  at least one second capacitor coupled between the high-side switch terminal and the low-side switch terminal for the respective at least the first one of the plurality of power semiconductor packages.

5. The apparatus of claim 1, wherein at least one of the plurality of power semiconductor packages to include a controller to affect operation of the respective high-side switches and low-side switches of the plurality of power semiconductor packages.

6. The apparatus of claim 5, wherein a controller of a first of the plurality of power semiconductor packages to provide at least one control signal in the control signals to at least one other of the plurality of power semiconductor packages.

7. The apparatus of claim 1, wherein series-capacitor converter comprises a multi phase series-capacitor buck arrangement.

8. The apparatus of claim 7, further comprising a plurality of inductors, wherein at least one inductor of the plurality of inductors is coupled between the respective low side switch terminals of the plurality of power semiconductor packages and a lower voltage node.

9. The apparatus of claim 8, wherein the first terminal coupled to the first node of the high-side switch for a first of the plurality of power semiconductor packages comprises a higher voltage node for the multi-phase series-capacitor buck arrangement.

10. The apparatus of claim 9, wherein the first terminal coupled to the first node of the high-side switch for a second of the plurality of power semiconductor packages is electrically coupled to the high-side switch terminal of a first of the plurality of power semiconductor packages, and wherein the second terminals coupled to the second nodes of the low-side switches for the respective plurality of power semiconductor packages are electrically coupled to a reference voltage source.

11. An apparatus, comprising:
  a package including a plurality of terminals coupled to one or more semiconductor dies positioned within the package, wherein the one or more semiconductor dies comprise a power transfer path including a high-side switch and a low-side switch, and wherein the plurality of terminals comprise:
    one or more first terminals coupled to a first node of the high-side switch;
    one or more second terminals coupled to a second node of the low-side switch;
    one or more high-side switch terminals coupled to a second node of the high side switch;
    one or more low-side switch terminals coupled to a first node of the low-side switch; and
  the package further comprising a plurality of lead frame contacts for receiving control signals, the plurality of lead frame contacts being arranged along an edge of the package.

12. An apparatus, comprising:
a converter including a plurality of power semiconductor packages, wherein the plurality of power semiconductor packages individually comprise:
   a power transfer path comprising at least a high-side switch and a low-side switch;
   a first terminal coupled to a first node of the high-side switch;
   a second terminal coupled to a second node of the low-side switch;
   a high-side switch terminal coupled to a second node of the high-side switch;
   a low-side switch terminal coupled to a first node of the low-side switch, wherein the high-side switch terminal and the low-side switch terminal comprise separate terminals; and
   a plurality of lead frame contacts for receiving control signals, the plurality of lead frame contacts being arranged along an edge of the individual power semiconductor package.

13. The apparatus of claim 12, wherein the high-side switch and the low-side switch are arranged in a horizontal fashion.

14. The apparatus of claim 12, wherein at least one of the high-side switch and the low-side switch includes a vertical field effect transistor in which the first node and the second node are arranged vertically with respect to each other along a direction perpendicular to a major surface of an individual power semiconductor package.

15. The apparatus of claim 14, wherein the vertical field effect transistor is a vertical metal oxide semiconductor field effect transistor.

16. The apparatus of claim 14, wherein the plurality of power semiconductor packages individually comprise an integrated circuit comprising driver circuitry.

17. The apparatus of claim 16, wherein the driver circuitry is electrically coupled to gate regions of the high-side switch and the low-side switch via one or more bond wires.

18. The apparatus of claim 14, wherein the high-side switch terminal is coupled to the second node of the high-side switch via a first copper clip, and
   the low-side switch terminal is coupled to the first node of the low-side switch via a second copper clip.

19. The apparatus of claim 18, wherein the first copper clip vertically overlaps at least portion of the high-side switch.

20. The apparatus of claim 18, wherein the second copper clip vertically overlaps at least portion of the low-side switch.

* * * * *

UNITED STATES PATENT AND TRADEMARK OFFICE
CERTIFICATE OF CORRECTION

| | |
|---|---|
| PATENT NO. | : 12,395,074 B2 |
| APPLICATION NO. | : 18/587418 |
| DATED | : August 19, 2025 |
| INVENTOR(S) | : David Giuliano |

Page 1 of 1

It is certified that error appears in the above-identified patent and that said Letters Patent is hereby corrected as shown below:

In the Specification

Column 1, Lines 5-6, change "U.S. patent application Ser. No." to --U.S. Patent Application No.--.

Column 3, Line 55, change "point-of-load (POL)-type" to --point-of-load (PoL)-type--.

Column 3, Line 57, change "POL-type converters" to --PoL-type converters--.

Signed and Sealed this
Twenty-third Day of September, 2025

John A. Squires
*Director of the United States Patent and Trademark Office*